United States Patent
Hirano

(10) Patent No.: US 6,353,550 B1
(45) Date of Patent: Mar. 5, 2002

(54) FERROELECTRIC MEMORY DEVICE

(75) Inventor: Hiroshige Hirano, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/661,370

(22) Filed: Sep. 13, 2000

(30) Foreign Application Priority Data

Sep. 14, 1999 (JP) .......................................... 11-260665

(51) Int. Cl.[7] .......................... G11C 11/12; G11C 11/22
(52) U.S. Cl. ....................... 365/145; 365/149; 365/203; 365/189.01
(58) Field of Search ................................ 365/145, 149, 365/189.01, 230.01, 203, 205

(56) References Cited

U.S. PATENT DOCUMENTS

| | | | | |
|---|---|---|---|---|
| 5,487,029 A | * | 1/1996 | Kuroda ........................ | 365/145 |
| 5,487,030 A | * | 1/1996 | Drab et al. .................. | 365/145 |
| 5,550,770 A | * | 8/1996 | Kuroda ........................ | 365/145 |
| 5,737,260 A | * | 4/1998 | Takata et al. ............... | 365/145 |
| 5,898,608 A | * | 4/1999 | Hirano et al. ............... | 365/145 |
| 5,969,982 A | * | 10/1999 | Koo ............................ | 365/145 |
| 6,034,287 A | * | 3/2000 | Koo ............................ | 257/295 |
| 6,151,242 A | * | 11/2000 | Takashima ................... | 365/145 |
| 6,201,733 B1 | * | 3/2001 | Hiraki et al. .......... | 365/185.08 |
| 6,229,730 B1 | * | 5/2001 | Kato ............................ | 365/145 |
| 6,262,910 B1 | * | 7/2001 | Takata et al. ................ | 365/145 |

FOREIGN PATENT DOCUMENTS

| | | | |
|---|---|---|---|
| JP | 407104342 | * | 4/1995 |
| JP | 408147983 A | * | 6/1996 |
| JP | 02001085632 | * | 3/2001 |

* cited by examiner

Primary Examiner—Viet Q. Nguyen
(74) Attorney, Agent, or Firm—Eric J. Robinson; Nixon Peabody LLP

(57) ABSTRACT

The ferroelectric memory device includes a plurality of memory cells arranged in a matrix at crossings of a plurality of word lines and a plurality of bit lines. Each memory cell includes at least one ferroelectric capacitor composed of a ferroelectric film and first and second electrodes sandwiching the ferroelectric film, a memory cell transistor interposed between the bit line and the first electrode of the ferroelectric capacitor, a cell plate line connected to the second electrode of the ferroelectric capacitor, a reset voltage supply line for supplying a voltage of a potential substantially identical to the potential at the cell plate line, a reset transistor interposed between the reset voltage supply line and the first electrode of the ferroelectric capacitor, and a reset control signal line for controlling ON/OFF of the reset transistor.

17 Claims, 17 Drawing Sheets

FERROELECTRIC MEMORY DEVICE

BACKGROUND OF THE INVENTION

The present invention relates to a ferroelectric memory device including memory cells each having a ferroelectric capacitor.

With the recent widespread use of small, high-performance electronic equipment provided with memory function, such as portable terminals and IC cards, demands for nonvolatile memories with low voltage, low power consumption, and high-speed operation suitable for such electronic equipment have increased. Flush memories are typical of non-volatile memories. From the standpoint of low power consumption and high-speed operation, however, ferroelectric memories have attracted attention. A ferroelectric memory stores non-volatile data utilizing the difference in the polarizing direction of a capacitor having a ferroelectric film. Accordingly, to rewrite data, only required is applying an electric field for inverting the polarizing direction. This has therefore features of low voltage, low power consumption, and high-speed operation.

A conventional configuration of memory cells constituting such a ferroelectric memory will be described with reference to FIGS. 21 through 23. FIG. 21 is an electric circuit diagram of a memory cell array of a conventional ferroelectric memory.

As shown in FIG. 21, the memory cell array of the conventional ferroelectric memory includes: a number of bit lines BL and a number of word lines WL extending to cross with each other; and a number of memory cells arranged in a matrix at positions corresponding to the respective crossings of the lines. Each memory cell includes: one memory cell transistor Q the gate electrode of which receives a signal from the word line WL; and one ferroelectric capacitor C interposed between the source region of the memory cell transistor Q and a cell plate line PL. FIG. 21 only illustrates four word lines WLa to WLd, four cell plate lines PLa to PLd, four bit lines BLa to BLd, and 16 sets of memory cell transistors Qaa to Qdd, and ferroelectric capacitors Caa to Cdd. It should be understood that the numbers of word lines and the like corresponding to the memory capacity (number of bits) of the ferroelectric memory are actually arranged. This also applies to FIGS. 22 and 23 to be described later.

The ferroelectric capacitor C includes a first electrode connected to the source region of the memory cell transistor and a second electrode connected to the cell plate line PL. This configuration will be described later in detail with reference to FIGS. 22 and 23. The memory cell structure of the ferroelectric memory strongly resembles the memory cell structure of a DRAM basically, but is different from that of the DRAM, which has a capacitor composed of a paraelectric, especially in that the ferroelectric capacitor C has a residual polarization characteristic (hysteresis characteristic) FIG. 24 is a view illustrating the residual polarization characteristic of a general ferroelectric capacitor C. The ferroelectric capacitor C generates positive residual polarization at point B or negative residual polarization at point D shown in FIG. 24, depending on the high/low relationship between the voltage applied to the first electrode of the ferroelectric capacitor C from the bit line BL via the memory cell transistor Q and the voltage applied to the second electrode of the ferroelectric capacitor C from the cell plate line PL.

For example, suppose it is defined during writing that the residual polarization is positive when the voltage applied to the first electrode of the ferroelectric capacitor C is a supply voltage VDD and the voltage applied to the second electrode thereof is a ground voltage,VSS ($\approx 0$), and that the residual polarization amount is L when the voltage applied to the first electrode of the ferroelectric capacitor C is the ground voltage VSS and the voltage applied to the second electrode thereof is the supply voltage VDD. During reading, when the potential at the ferroelectric capacitor C is read to the bit line BL by turning ON the memory cell transistor Q, the voltage at the bit line BL is high or low depending on whether the polarization of the ferroelectric capacitor C is positive or negative. The difference between the potential at the bit line and a reference potential is amplified by a sense amplifier (not shown), to allow the data to be determined "1" or "0".

In a one-transistor one-capacitor (1T1C) memory cell, one common reference cell is provided for a number of cells (for example, one for 256 cells), and a sense amplifier amplifies the difference between the reference potential read from the reference cell and each potential read to the bit line, to determine data "1" or "0" depending on which potential is higher.

In a two-transistor two-capacitor (2T2C) memory cell, one memory cell is configured as follows. For example, in the structure shown in FIG. 21, one memory cell is composed of two transistors Qaa and Qba connected to one word line WLa and two bit lines BLa and BLb, and two ferroelectric capacitors Caa and Cba. Data "1" is allocated and stored when the polarization of the ferroelectric capacitor Caa is positive and the polarization of the ferroelectric capacitor Cba is negative, and data "0" is allocated and stored when the polarization of the ferroelectric capacitor Caa is negative and the polarization of the ferroelectric capacitor Cba is positive. During reading, the potential difference between the two bit lines BLa and BLb is amplified with a sense amplifier (not shown) provided between the two bit lines BLa and BLb. Data "1" or "0" is determined depending on which potential is higher.

The structure of the memory cell array of the ferroelectric memory on a semiconductor substrate will be described. FIG. 22 is a top view of the conventional ferroelectric memory where only the structure of the memory cell array located on a semiconductor substrate is illustrated and an interlayer insulating film is transparent.

As shown in FIGS. 22 and 23, active regions (source/drain regions, channel regions, and the like) of the transistors Q are formed in a semiconductor substrate 100. The word lines WL made of polysilicon, which serve as gate electrodes at positions above the channel regions, extend above the semiconductor substrate 100. Capacitance portions are formed above the respective source regions of the transistors Q. Each capacitance portion includes: a bottom electrode BE (first electrode) of the ferroelectric capacitor C, made of any of metals including metals of platinum and iridium group, which is an equivalent of a storage node of a DRAM; a ferroelectric film FD made of $KNO_3$, $PbLa_2O_3$—$ZrO_2$—$TiO_2$ (PLZT), $PbTiO_3$—$PbZrO_3$ (PZT), or the like; and a top electrode TE (second electrode) made of any of metals including metals of platinum and iridium group. The bottom electrode BE of the capacitance portion is connected to the source of the memory cell transistor Q via a contact CS. This structure of the capacitance portion is called a stacked capacitor structure. The top electrodes TE constitute part of the cell plate lines PL that extend in parallel with the word lines WL as shown in FIG. 22. Above the capacitance portions, the bit lines BL extend in a direction parallel with the cross section of FIG. 23, and connected to the drain regions of the memory cell transistors Q via contacts CW. An interlayer insulating film 101 is formed over the semiconductor substrate 100 burying the contacts CS, the bottom electrodes BE, the ferroelectric films FD, the top electrodes TE (cell plate lines PL), the contacts CW, the bit lines BL, and the like. A LOCOS isolation insulation film electrically isolates every opposing source regions of adjacent memory cell transistors from each other. The portions other than the active regions enclosed by the rectangles in FIG. 22 represent the LOCOS isolation film.

Referring to FIGS. 21 through 23, in the memory cell array of the conventional ferroelectric memory, one cell plate line PL is provided for each word line WL. Such cell plate lines PL occupy a large area of the memory cell array as is apparent from FIG. 22. For separation of the cell plate lines of the adjacent memory cells from each other, it is required to secure a sufficiently wide gap between the cell plate lines. With this configuration, therefore, it is difficult to reduce the area occupied by the memory cell array.

Moreover, since the cell plate lines PL must be driven for operation, the speed of the device is disadvantageously lowered by a value corresponding to the time required for driving the cell plate lines.

In order to obviate the above two inconveniences, one common cell plate line PL may be provided for every two adjacent memory cells, in place of providing the cell plate line PL for every word line, and the voltage may be set at an intermediate potential. In other words, one cell plate line PL is provided for every two word lines WL, and the voltage at the cell plate line PL is fixed to (½) VDD, for example, during writing. By this setting, it is possible to generate positive residual polarization of the ferroelectric capacitor C when the voltage at the bit line BL is VDD and generate negative residual polarization of the ferroelectric capacitor C when the voltage at the bit line BL is the ground potential VSS ($\approx 0$). Thus, 1T1C or 2T2C memory cells can be formed as in the manner described above.

However, the above configuration has the following problem. The potential at the source region of a memory cell transistor is gradually closer to the ground voltage VSS due to junction leak. Therefore, if the potential at the cell plate line PL is kept fixed to the (½) VDD for a long period of time, polarization data at the ferroelectric capacitor may possibly be corrupted. To avoid this inconvenience, data may be refreshed, for example. However, refreshing causes other inconveniences of increasing powder consumption of the ferroelectric memory and complicating the control.

SUMMARY OF THE INVENTION

An object of the present invention is providing a ferroelectric memory device allowing for high-speed operation and reduced power consumption without causing inconveniences as described above by adopting measures for eliminating the necessity of driving cell plate lines.

The ferroelectric memory device of the present invention includes: a plurality of word lines; a plurality of bit lines crossing with the plurality of word lines; memory cells arranged in a matrix at respective crossings of the plurality of word lines and the plurality bit lines; at least one ferroelectric capacitor formed in each of the memory cells, the ferroelectric capacitor including a ferroelectric film and first and second electrodes sandwiching the ferroelectric film; at least one memory cell transistor formed in each of the memory cells, the memory cell transistor being interposed between the bit line and the first electrode of the ferroelectric capacitor, a gate of the memory cell transistor being connected to the word line; cell plate lines connected to the second electrodes of the ferroelectric capacitors; reset voltage supply lines for supplying a voltage having a potential substantially identical to the potential at the cell plate lines; reset transistors formed of switching transistors each interposed between the reset voltage supply line and the first electrode of the ferroelectric capacitor; and reset control signal lines for controlling ON/OFF of the reset transistors.

With the above configuration, data writing and reading can be done without the necessity of controlling the switch of the potential at the cell plate line between the ground potential and the supply potential as in the conventional ferroelectric memory device. In addition, the potentials at the first and second electrodes can be controlled to be substantially identical to each other by use of the reset transistor. This prevents data corruption caused by the first electrode being floated for a long period of time, without the necessity of refreshing.

In the above ferroelectric memory device, the memory cell may include each two of the memory cell transistors and the ferroelectric capacitors, establishing the 2T2C memory cell structure. In this case, also, one reset transistor is required for each of the ferroelectric capacitors.

In the above ferroelectric memory device, when the amplitude of a voltage at the bit lines is between a supply potential and a ground potential, the cell plate lines preferably supply an intermediate potential between the supply potential and the ground potential.

In the above ferroelectric memory device, the reset transistors may be configured to be ON during a standby period. With this configuration, during the standby period, a voltage signal from the reset voltage supply line is applied to the first electrodes of the ferroelectric capacitors. This ensures prevention of data corruption caused by the first electrodes of the ferroelectric capacitors being floated for a long period of time.

In the above ferroelectric memory device, the ferroelectric capacitor may be of a stacked structure where the first electrode is formed below the second electrode. With this structure, the second electrodes serving as the cell plate lines may be the top electrodes, and thus it is easy to realize the structure where the adjacent memory cells share the top electrodes (cell plate lines).

In the ferroelectric memory device, the reset transistor and the memory cell transistor may share one of diffusion layers. This further reduces the occupation area of the memory cell array.

In the ferroelectric memory device, the reset voltage supply line is formed of a conductive layer including a diffusion layer. This further reduces the occupation area of the memory cell array.

In the above ferroelectric memory device, the reset voltage supply line may include a backing line layer connected to a diffusion layer. This reduces the resistance and thus enhances the speed of the operation of memory cells.

In particular, the backing line layer is preferably made of the same metal material as the first electrodes of the ferroelectric capacitors.

In the above ferroelectric memory device, the reset transistor for switching the connection between the first electrode of the ferroelectric capacitor of one of two adjacent memory cells and the reset voltage supply line is interposed between the memory cell transistors of the two memory cells, and shares diffusion layers with the memory cell transistors on both sides, and the other reset transistor for switching the connection between the first electrode of the ferroelectric capacitor of the other of the two adjacent memory cells and the reset voltage supply line is formed so as to share diffusion layers with two memory cell transistors adjacent along the word line. This greatly reduces the occupation area of the memory cell array.

In the above configuration, the reset control signal line serving as gate electrodes of the reset transistors may have protrusions branching on one side at positions between the bit lines to serve as gate electrodes of the other reset transistors. In this case, it is possible to increase the proportion of the portions of the reset control signal lines that can be formed above the isolation insulation film. This reduces the parasitic capacitance and thus enhances the operation speed of the reset transistors.

The reset control signal line serving as gate electrodes of the reset transistors may have protrusions branching on alternate sides at positions between the bit lines to serve as gate electrodes of the other reset transistors. In this case, it is possible to provide the memory cell structures of the same geometry, and thus suppress a variation in geometry during the fabrication process.

The reset control signal line serving as gate electrodes of the reset transistors may have protrusions branching on both sides at positions between the bit lines to serve as gate electrodes of the other reset transistors. In this case, the reset control signal lines can be linear. This reduces the resistance of the reset control signal lines and thus enhances the operation speed of the reset transistors.

In the ferroelectric memory device, the bit lines may constitute bit pairs each composed of a first bit line and a second bit line formed with a sense amplifier therebetween, and memory cells among the plurality of memory cells connected to a common bit line may belong to either a first memory cell group connected to the first bit line or a second memory cell group connected to the second bit line. With this configuration, it is possible to arrange the memory cells into various patterns, to adopt a configuration suitable for the 1T1C memory cell structure.

As an example, each of the memory cells may include one memory cell transistor and one ferroelectric capacitor, the memory cell transistors of two adjacent memory cells among the plurality of memory cells may share one diffusion layer, and the memory cells may be divided into the first memory cell groups connected to the first bit lines and the second memory cell groups connected to the second bit lines every two adjacent memory cells, resulting in the first memory cell groups and the second memory cell groups being arranged in a zigzag fashion on the plane, that is, a so-called folded bit line structure.

The formation of the reset transistors provides effects as follows also for the devices in which the potential at the cell plate lines is switched between the ground potential and the supply potential. For example, when a certain memory cell is selected, no electric field is preferably applied between the electrodes of the ferroelectric capacitors of non-selected memory cells. However, there may sometimes arise the case that a potential difference is generated in ground potential at portions in the memory cell due to noise caused by an operating current for operation of the transistor connected to the electrode of the ferroelectric capacitor. Specifically, a difference may be generated between a substrate potential at a portion near a memory cell or the ground potential at the storage node and the ground potential at a portion near a drive circuit for driving the cell plate for the memory cell. This potential difference is applied to the capacitor, and this reduces the polarization of the capacitor and thus deteriorates the data retaining characteristic. According to the present invention, the reset transistor is controlled to be ON during the standby period. This prevents such a potential difference due to noise from being applied between the two electrodes of the ferroelectric capacitor, and thus the data retaining characteristic enhances. In particular, a large current flows in a cell plate line drive circuit portion connected to a selected memory cell for control of switching of the potential at the cell plate line. This may cause noise and possibly adversely influence the surrounding memory cells including the adjacent memory cells of the selected memory cell. According to the present invention, this adverse influence of noise can be suppressed.

The amplitude of the bit lines may be between a supply potential and a ground potential, the amplitude of the cell plate line for a selected memory cell among the memory cells may be between the supply potential and the ground potential, and the reset control signal lines may control the reset transistors of non-selected memory cells among the memory cells to be ON.

The ferroelectric memory device of the present invention allows for control of, for example, turning OFF the reset transistor after the rising of the word line. This control provides an effect of reducing the influence due to noise at the rising of the word line. Likewise, control may be done, so that the reset transistor is turned ON before the falling of the word line. This reduces the influence due to noise at the falling of the word line. This effect is obtainable both for the ferroelectric memory device configured not to vary (to fix) the potential at the cell plate lines and the ferroelectric memory device configured to vary the potential at the cell plate lines.

After the first electrode of the ferroelectric capacitor is isolated from the bit line, it may be reset by the reset transistor. This allows for resetting without influence of noise from the bit line, or resetting at high speed in the case where the capacitance of the ferroelectric capacitor is small. This effect is also obtainable both for the ferroelectric memory device configured not to vary (to fix) the potential at the cell plate lines and the ferroelectric memory device configured to vary the potential at the cell plate lines.

DESCRIPTION OF THE PREFERRED EMBODIMENTS

First Embodiment

Circuit Configuration

Figure 1:
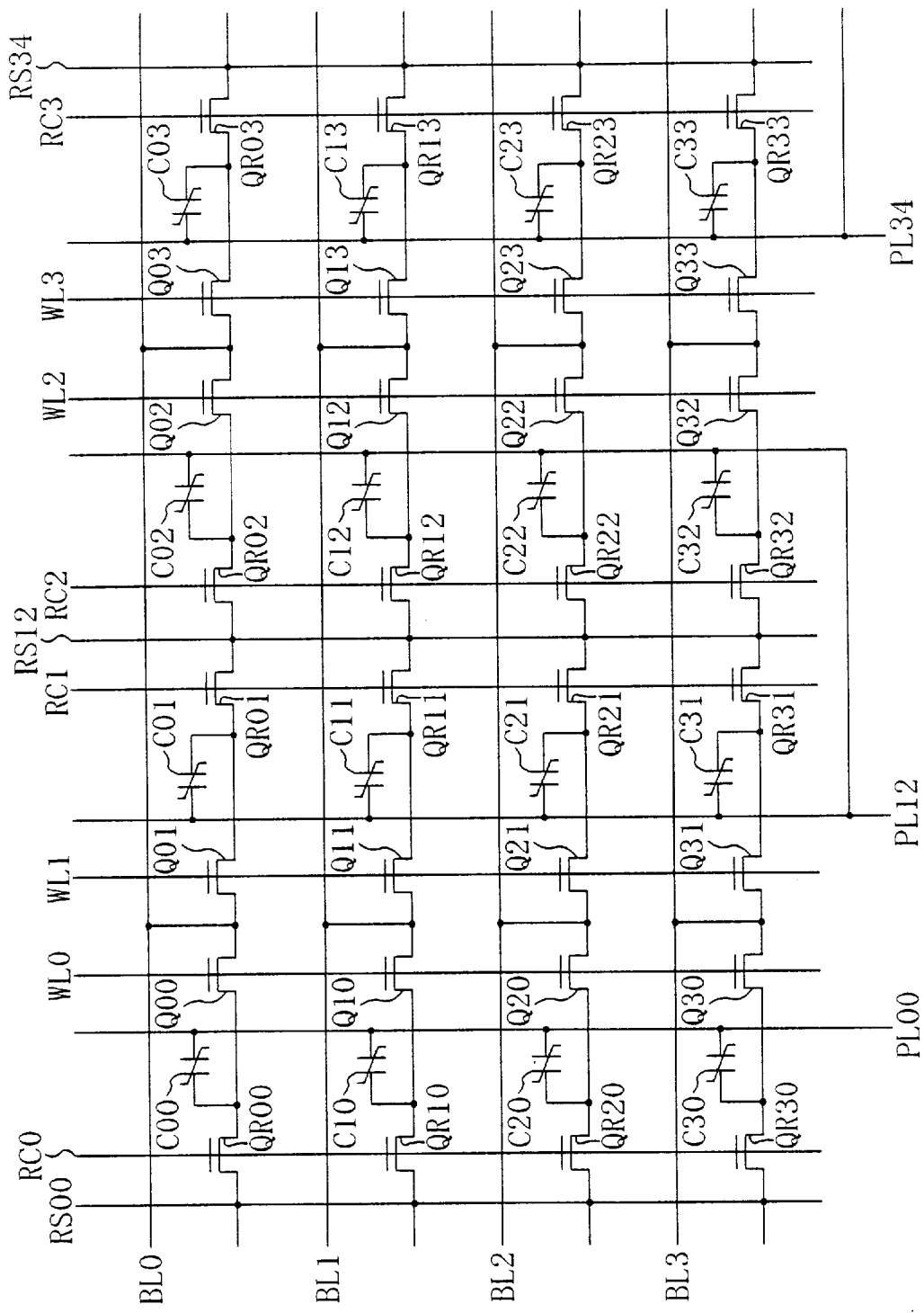
FIG. 1 is an electric circuit diagram illustrating a common circuit configuration of memory cell arrays of ferroelectric memories of the first and second embodiments of the present invention.

FIG. 1 is an electric circuit diagram illustrating a common circuit configuration of memory cell arrays of ferroelectric memories of the first and second embodiments of the present invention.

Referring to FIG. 1, the memory cell array of the ferroelectric memory of the first embodiment includes: a number of bit lines BL and a number of word lines WL extending to cross with each other; and a number of memory cells arranged in a matrix at positions corresponding to the respective crossings of the lines. Each memory cell includes: one memory cell transistor Q the gate electrode of which receives a signal from the word line WL; and one ferroelectric capacitor interposed between the source region of the memory cell transistor Q and a cell plate line PL. The ferroelectric capacitor C includes a first electrode connected to the source region of the memory cell transistor Q and a second electrode connected to the cell plate PL. This configuration is illustrated in detail in FIGS. 2 and 3 and will be described later in detail.

Figure 22:
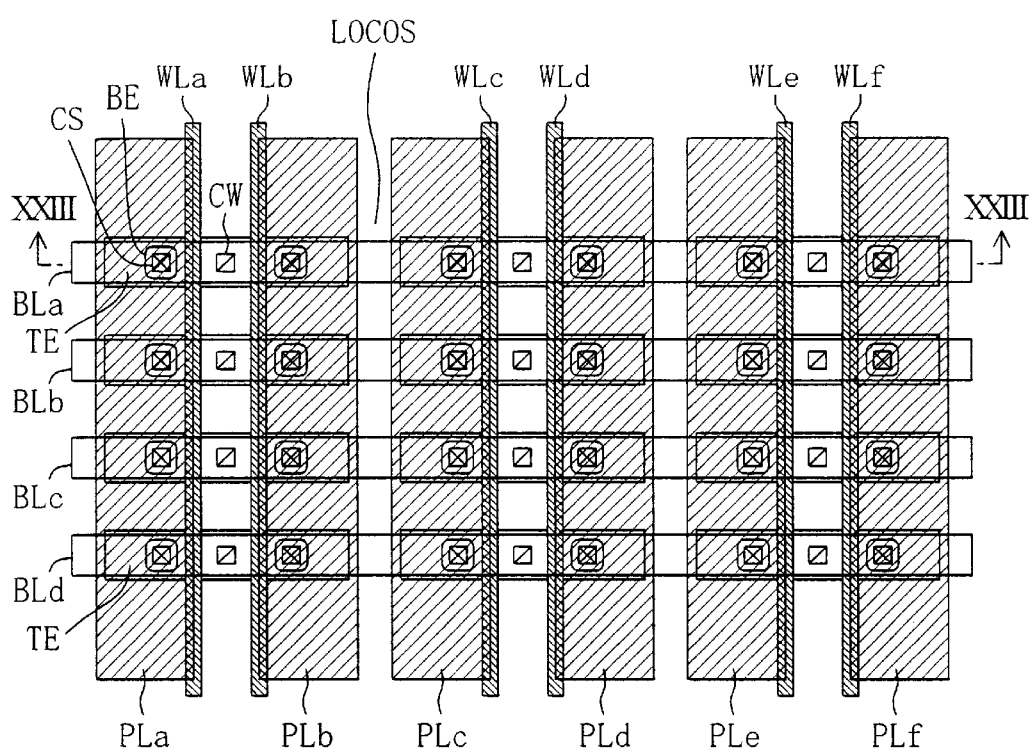
FIG. 22 is a top view of the conventional ferroelectric memory, illustrating only the structure of the memory cell array located on a semiconductor substrate.

The first feature of this embodiment is that the voltage at the cell plate lines PL is fixed to a constant value and one cell plate line PL is not provided for each word line WL as in the conventional ferroelectric memory cell, but is provided for every two word lines. Specifically, for example, a cell plate line PL12 corresponds to unified (shared) one of the cell plate lines PLb and PLc shown in FIG. 22, and a cell plate line PL34 corresponds to unified (shared) one of the cell plate lines PLd and PLe shown in FIG. 22. Note that a cell plate line PL00 is not shared since this is located at an outermost position of the memory cell array. The potential at all the cell plate lines PL is fixed to (½) VDD. The potential at the cell plate lines is not necessarily fixed to (½) VDD, but may be any value as far as it is constant.

The second feature of this embodiment is that reset control signal lines RC, reset transistors QR, and the reset voltage supply lines RS are provided for supplying the potential (½) VDD to the first electrodes of the ferroelectric capacitors C during a standby period. Each reset transistor QR is formed so as to share the source region with the memory cell transistor Q. The drain region of the reset transistor QR serves as the reset voltage supply line RS. Also, the gate electrodes of the reset transistors QR lined along one word line constitute one reset signal control line RC. With this configuration, once the reset transistor QR is turned ON depending on the signal on the reset signal control line RC, the voltage (½) VDD is supplied from the reset voltage supply line RS to the first electrode of the ferroelectric capacitor C. By this voltage supply, the potential difference between the first and second electrodes of the ferroelectric capacitor C becomes substantially zero.

In FIG. 1, shown are four word lines WL0 to WL3, four bit lines BL0 to BL4, 16 sets of memory cell transistors Q00 to Q33 and ferroelectric capacitors C00 to C33 arranged at the respective crossings of these lines, three cell plate lines PL00, PL12, and PL34, three reset voltage supply lines RS00, RS12, and RS34, four reset control signal lines RC0 to RC3, and 16 reset transistors QR00 to QR33. It should be understood that the numbers of signal lines, transistors, ferroelectric capacitors, and the like corresponding to the memory capacity (number of bits) of the ferroelectric memory are actually arranged. This also applies to FIGS. 2 and 3 to be described later, as well as, all the drawings to be referred to in embodiments to follow.

Figure 24:
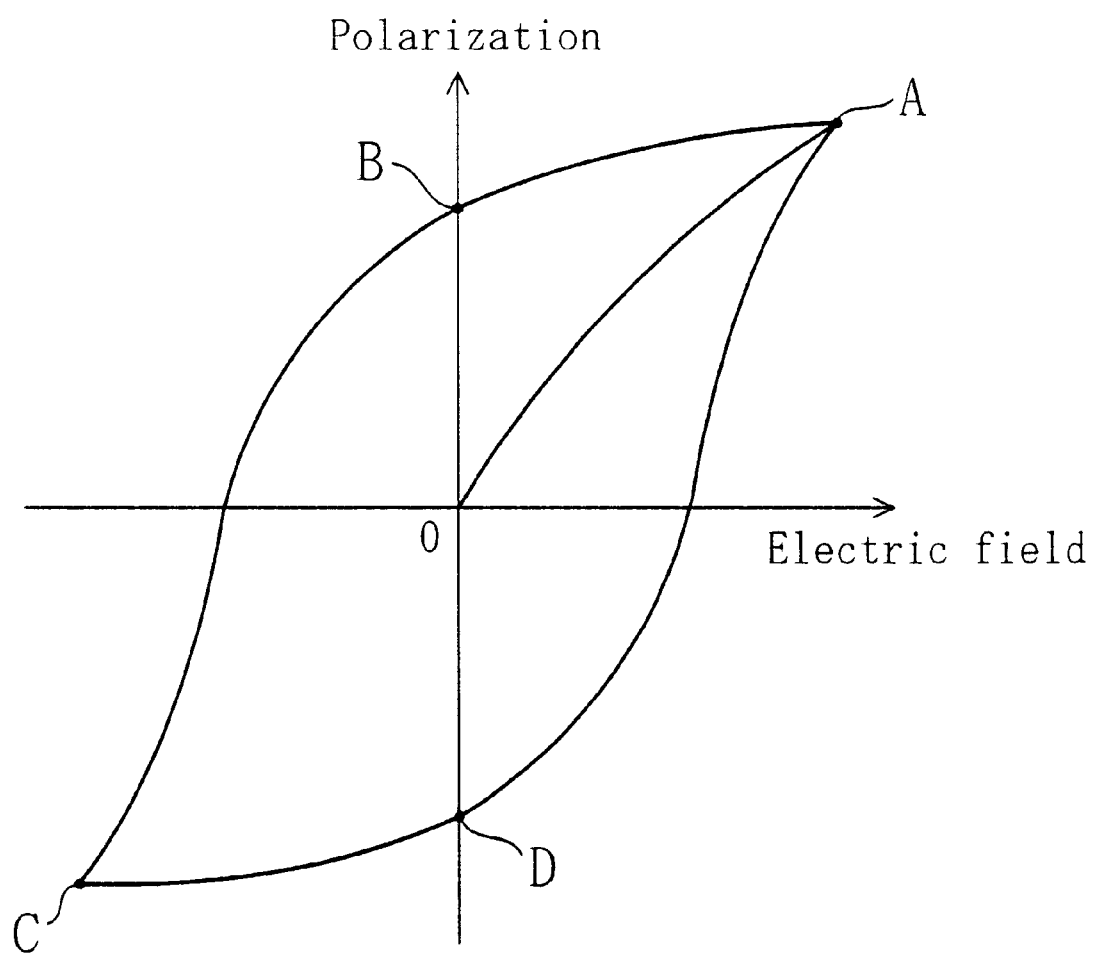
FIG. 24 is a view showing the residual polarization characteristic of a general ferroelectric capacitor C.

The ferroelectric capacitors C in this embodiment also have the residual polarization characteristic shown in FIG. 24. That is, positive (point B) or negative (point D) residual polarization is exhibited depending on the high/low relationship between the voltage (VSS or VDD) applied to the first electrode of the ferroelectric capacitor C from the bit line BL via the memory cell transistor Q, and the voltage (½) VDD applied to the second electrode of the ferroelectric capacitor C from the cell plate line PL.

Operation Mode

The memory cell array of the ferroelectric memory of this embodiment can be used as the array of 1T1C or 2T2C memory cells.

In this embodiment, it is defined during writing that the residual polarization is "positive" when the voltage applied to the first electrode of the ferroelectric capacitors C is the supply voltage VDD, that is, higher than the voltage (½)

VDD applied to the second electrode, and that the residual polarization is "negative" when the voltage applied to the first electrode is the ground voltage VSS, that is, lower than the voltage (½) VDD applied to the second electrode. During reading, when the potential at the ferroelectric capacitor C is read to the bit line BL by turning ON the memory cell transistor Q, the voltage at the bit line BL is high or low depending on whether the polarization of the ferroelectric capacitor C is positive or negative. The difference between the potential at the bit line and a reference potential is amplified by a sense amplifier (not shown), to allow the data to be determined "1" or "0".

In a 1T1C memory cell, one common reference cell is provided for a number of cells (for example, one for 256 cells), and a sense amplifier amplifies the difference between a reference potential read from the reference cell and each potential read to the bit line, to determine data "1" or "0" depending on which potential is higher.

In a 2T2C memory cell, one memory cell has the following configuration. Referring to FIG. 1, for example, one memory cell is composed of two transistors Q00 and Q10 connected to one word line WL0 and two bit lines BL0 and BL1, and two ferroelectric capacitors C00 and C10. For example, data "1" is allocated and stored when the polarization of the ferroelectric capacitor C00 is positive and the polarization of the ferroelectric capacitor C10 is negative, and data "0" is allocated and stored when the polarization of the ferroelectric capacitor C00 is negative and the polarization of the ferroelectric capacitor C10 is positive. During reading, the potential difference between the two bit lines BL0 and BL1 is amplified with a sense amplifier (not shown) provided between the two bit lines BL0 and BL1. Data "1" or "0" is determined depending on which potential is higher.

In general, the memory cell array of the 1T1C memory cell structure occupies a smaller area, but disadvantageously tends to cause malfunction due to noise. That is, the reliability is low. In particular, in the case where the voltage at the cell plate lines PL is set at (½) VDD, as in this embodiment, the residual polarization amount generated in the ferroelectric capacitor C is small. To ensure reliability, therefore, the 2T2C memory cell structure should preferably be adopted.

Next, described are two examples of operation such as reading of data in memory cells utilizing the feature of this embodiment of supplying a reset voltage.

1. First Example

Figure 4A:
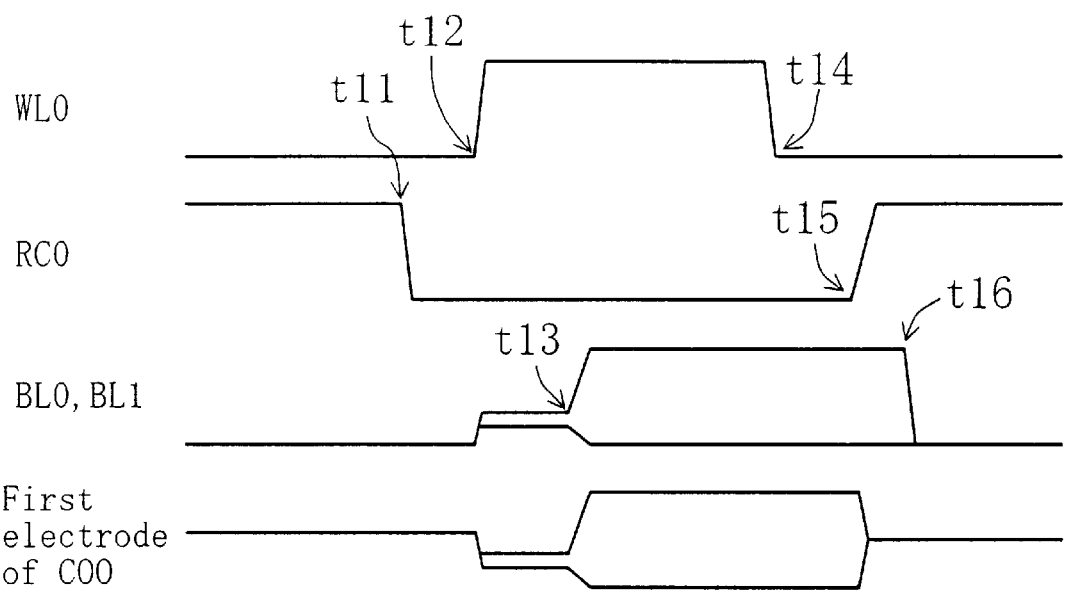
FIGS. 4A and 4B are timing charts of first and second examples, respectively, of operation during data reading applicable to the embodiments of the invention.

FIG. 4A is a timing chart showing changes in the potential of signals and the like during reading of data in a memory cell in the first example. Assuming that the 2T2C memory cell structure is adopted, the operation of reading data in the memory cell including the two memory transistors Q00 and Q10 connected to the word line WL0 and the bit lines BL0 and BL1 and the two ferroelectric capacitors C00 and CL0 is described as follows.

First, in a normal operation state, the voltage at the cell plate line PL is fixed to (½) VDD, for example. The voltage at the reset voltage supply line RS is also fixed to the same voltage as that at the cell plate line PL (i.e., (½) VDD, for example). During the standby state (until timing t11), the reset transistors QR00 and QR10 are kept ON by setting the reset control signal line RC0 at H level, so that the potentials at the two electrodes of each of the ferroelectric capacitors C00 and C10 are both (½) VDD. In other words, by having little potential difference between the two electrodes of each of the ferroelectric capacitors C00 and C10, the residual polarization of the ferroelectric film is controlled to be free from corruption. The bit lines BL0 and BL1 have been precharged to the potential of 0 V. The potential at the word line WL0 is L naturally.

When reading starts at timing t11, the potential at the reset control signal line RC0 is turned to L level to turn OFF the reset transistors QR00 and QR10 and thus to put the first electrodes of the ferroelectric capacitors C00 and C10 in a floating state. The bit lines BL0 and BL1 are also put in a floating state.

At timing t12, the potential at the word line WL0 is turned to H level, to turn ON both memory cell transistors Q00 and Q10. This connects the bit lines BL0 and BL1 and the first electrodes of the ferroelectric capacitors C00 and C10, respectively, so that the voltages at the fist electrodes corresponding to the polarization of the ferroelectric capacitors C00 and C10 are allowed to be read to the bit lines BL0 and BL1. Thus, if the residual polarization of the ferroelectric capacitor C00 is positive and that of the ferroelectric capacitor C10 is negative, the voltage at the bit line BL0 is higher than the voltage at the bit line BL1.

At timing t13, the potential difference between the bit lines BL0 and BL1 is amplified with a sense amplifier to a value as large as the potential difference between 0 V (VSS) and the supply voltage VDD, to read data. During this step, data rewriting is being carried out for the ferroelectric capacitors C00 and C10.

At timing t14, the potential at the word line WL0 is turned to L level, to turn OFF the memory cell transistors Q00 and Q10. This electrically isolates the bit lines BL0 and BL1 from the first electrodes of the ferroelectric capacitors C00 and C10, so that the first electrodes of the ferroelectric capacitors C00 and C10 are temporarily put in a floating state.

At timing t15, the potential at the reset control signal line RC0 is raised to H level to turn ON the reset transistors QR00 and QR10. As a result, the potential at the first electrodes of the ferroelectric capacitors C00 and C10 is again (½) VDD, and thus the potential difference from the second electrodes becomes substantially zero.

At timing t16, the bit lines BL0 and BL1 is precharged to the potential of 0 V, to enter the standby state.

As is apparent from the change in potential at the first electrode of the ferroelectric capacitor C00 with time in FIG. 4A, in this example, the potential difference between the two electrodes of each ferroelectric capacitor C is kept substantially zero over the period (standby period) other than the short reading period (from timing t12 through timing t15). During a limited period between timing t14 and timing t15, the first electrode of the ferroelectric capacitor C is put in a floating state. This period is too short to cause a problem in a normal ferroelectric memory judging from the fact that a junction leak is generated in a time of about 10 seconds. Therefore, it is possible to fix the cell plate line PL to (½) VDD at all times without causing a problem of corruption of the residual polarization state of the ferroelectric capacitor C. Since no refreshing (rewriting) is required, increase in power consumption is avoided. In addition, as will be described later, by sharing the cell plate line PL, the occupation area of the memory cell array is reduced, and high reliability is ensured.

Moreover, the potential at the cell plate line PL is not switched between 0 and VDD as in the conventional ferroelectric memory, but retained at (½) VDD at all times. This simplifies the control and allows for high-speed writing, reading, and rewriting.

The potential at the cell plate line PL and that at the reset voltage supply line RS are controlled to become (½) VDD simultaneously by means of signals on the word line WL and the reset control signal line RC at the activation of the device, so as not to cause data corruption. However, if a voltage is applied to the ferroelectric capacitors C of all the memory cells simultaneously, the peak power consumption will be enormous. In general, therefore, the memory cell array is further divided into a plurality of blocks, and the voltage (½) VDD is applied to the respective blocks at shifted timings.

The voltage at the cell plate lines PL is not necessarily constant at all times. Otherwise, the potential at the cell plate lines PL may change and the potential at the reset voltage supply lines may follow this change to be substantially the same potential. Changing the potential at the cell plate lines will be described later in the third and fourth examples.

2. Second Example

Figure 4B:
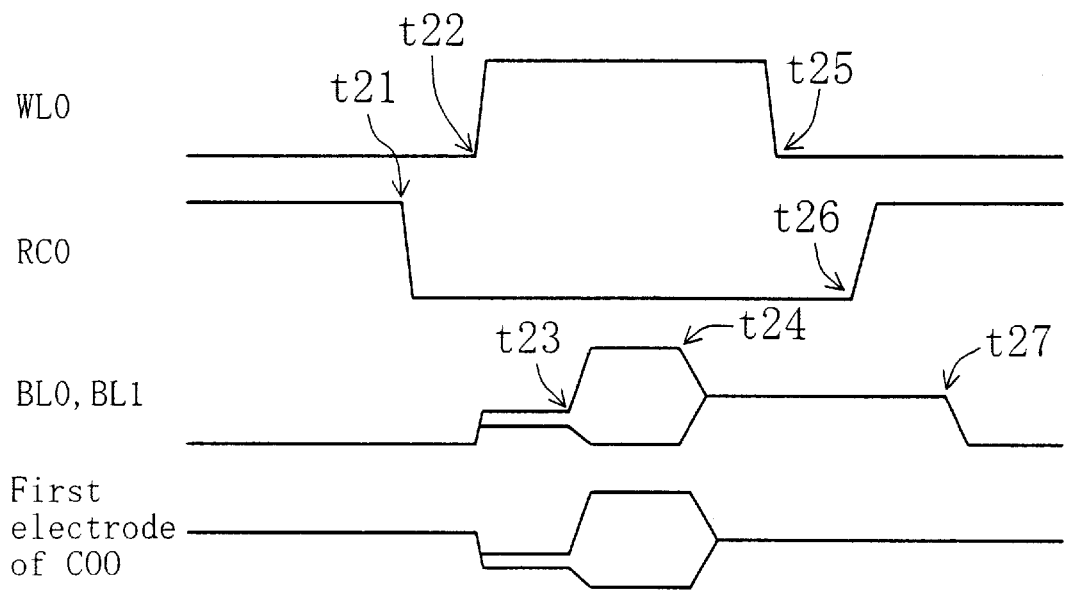

In this example, substantially the same operations at timings t11, t12, t13, t14, and t15 in the first example are carried out at timings t21, t22, t23, t25, and t26 shown in FIG. 4B, respectively.

This example is different from the first example in that after completion of the data reading with the sense amplifier and rewriting starting at timing t23, the potential at the first electrodes of the ferroelectric capacitors C00 and C10 is made (½) VDD by equalizing the bit lines BL0 and BL1 at timing t24. Therefore, from this point until the reset transistors QR00 and QR10 are turned ON by the rising of the reset control signal line RC0 at timing t26, also, the potential difference between the two electrodes of each of the ferroelectric capacitors C00 and C10 is kept substantially zero. After the rising of the reset control signal line RC0, the potential at the bit lines BL0 and BL1 is precharged to 0 V at timing t27. Timing t27 may precede timing t26 as long as it follows timing t25.

In this example, the intermediate potential (½) VDD is supplied to the first electrodes of the ferroelectric capacitors C by equalizing the bit lines BL before the first electrodes of the ferroelectric capacitors C are electrically isolated from the bit lines BL due to the falling of the word line WL0 after rewriting. Accordingly, as is apparent from the change in potential at the first electrode of the ferroelectric capacitor C00 with time in FIG. 4B, the potential difference between the two electrodes of each of the ferroelectric capacitors C of the memory cells connected to the selected word line is kept substantially zero over the period other than the significantly short period during reading (from timing t21 to timing t24). In this example, therefore, after reading and rewriting, the potential at the first electrodes of the ferroelectric capacitors is made (½) VDD by equalizing the bit lines as the first stage and then by connecting the first electrodes to the reset voltage supply line RS as the second stage. This allows for swift shift of the potential at the first electrodes to (½) VDD, compared with the first example. This is due to the fact that the first-stage reset operation is carried out by way of the bit lines that are constructed of metal wiring with a reduced resistance and thus are high in the ability of driving the reset transistors, whereas the second-stage reset operation is carried out by way of the reset voltage signal line RS that is constructed of a diffusion layer with a high resistance and thus is low in the ability of driving the reset transistors. Alternatively, the order of timing t25 and timing t26 may be reversed. This allows the reset operation to be carried out without putting the first electrodes of the ferroelectric capacitors C in a floating state, and thus suppresses data corruption more effectively.

Moreover, the potential at the cell plate line PL is not switched between 0 and VDD as in the conventional ferroelectric memory, but retained at (½) VDD at all times. Control is therefore simplified. Also, since rewriting is carried out simultaneously with amplification of read data with a sense amplifier, high-speed writing, reading, and rewriting are possible.

For protection of non-volatile data, it is necessary to ensure that no electric field is applied to the ferroelectric capacitors at activation of the device. For this reason, the signal on the reset control signal line RC is preferably set at H level ((½) VDD) upon activation of the device. It is also preferable to design so that the potential at the cell plate lines PL and the potential at the reset voltage supply lines RS become (½) VDD simultaneously at activation of the device. However, if the cell plate lines PL and the reset voltage supply lines PS for all the memory cells are simultaneously driven, peak power consumption will be enormous possibly causing inconvenience. In general, therefore, the memory cell array is further divided into a plurality of locks, and the respective blocks are driven at shifted timings. The driving ability may be suppressed to reduce the peak current.

The potential at the cell plate lines PL is not necessarily constant at all times. Otherwise, the potential at the cell plate lines PL may change and the potential at the reset voltage supply lines may follow this change to be substantially the same potential. Changing the potential at the cell plate lines will be described in the third and fourth examples to follow.

3. Third Example

Figure 3:
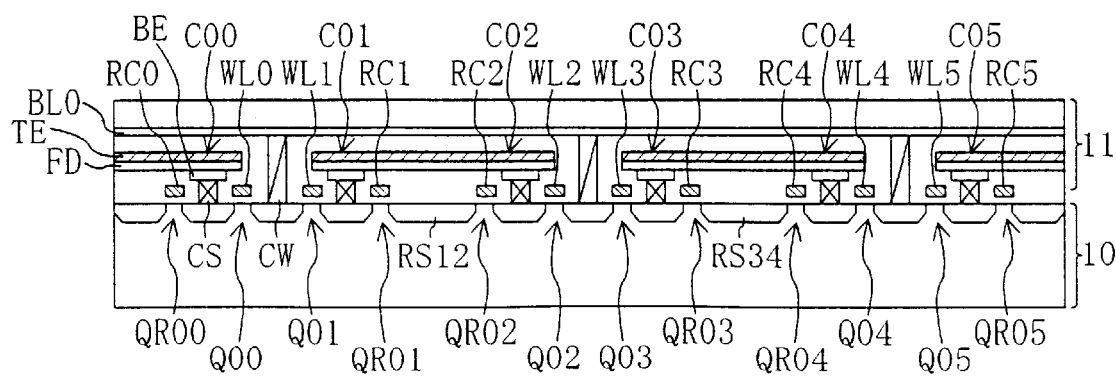
FIG. 3 is a cross-sectional view taken along line III—III of FIG. 2.
Figure 25A:
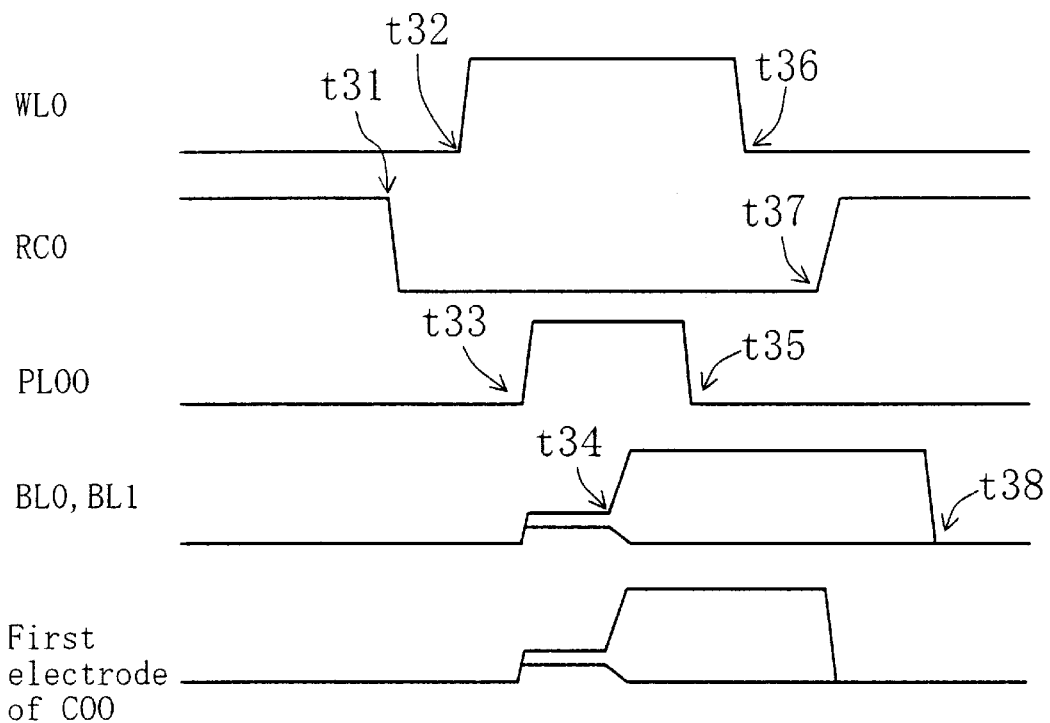
FIGS. 25A and 25B are timing charts of third and fourth examples, respectively, of operation during data reading applicable to the embodiments of the invention.
Figure 25B:
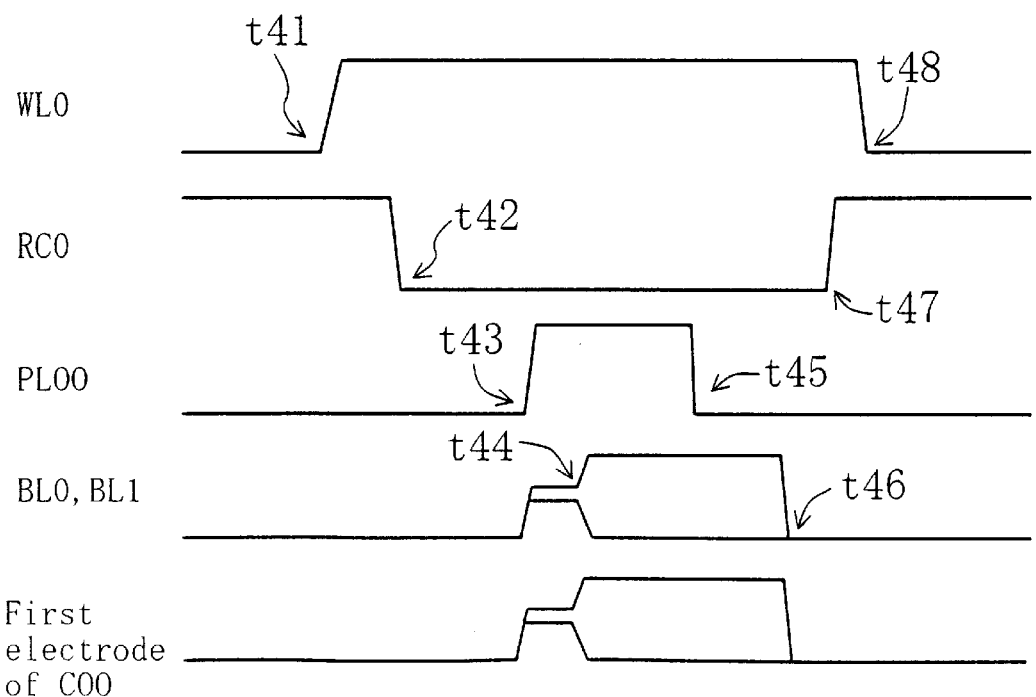

FIGS. 25A and 25B are timing charts showing changes in the potential of signals and the like during reading of data in memory cells in the third and fourth examples, respectively. Assuming that the 2T2C memory cell structure is adopted, the operation of reading data in the memory cell including two memory transistors Q00 and Q10 connected to the word line WL0 and the bit lines BL0 and BL1, and the two ferroelectric capacitor C00 and C10 shown in FIG. 3 is described as follows.

Referring to FIG. 25A, during the standby state (until timing t31) the voltage at the cell plate line PL is VSS (0 V). The voltage at the reset voltage supply line RS is fixed to the same voltage (VSS) as that at the cell plate line PL at all times during the standby state. During the standby state, the reset transistors QR00 and QR10 are kept ON by setting the signal on the reset control signal line RC0 at H level, so that the potentials at the two electrodes of each of the ferroelectric capacitors C00 and C10 are both VSS. In other words, by having little potential difference between the two electrodes of each of the ferroelectric capacitors C00 and C10, the residual polarization of the ferroelectric film is controlled to be free from corruption. The bit lines BL0 and BL1 have been precharged to the potential of 0 V. The potential at the word line WL0 is L naturally.

When reading starts at timing t31, the potential at the reset control signal line RC0 is turned to L level to turn OFF the reset transistors QR00 and QR10 and thus to put the first electrodes of the ferroelectric capacitors C00 and C10 in a floating state. The bit lines BL0 and BL1 are also put in a floating state.

At timing t32, the potential at the word line WL0 is turned to H level, to turn ON both memory cell transistors Q00 and Q10. This connects the bit lines BL0 and BL1 and the first electrodes of the ferroelectric capacitors C00 and C10, respectively.

Thereafter, at timing t33, the potential at the cell plate line PL is turned to H level (VDD). This allows the voltages at the first electrodes, which correspond to the potential at the cell plate PL and the polarization of the ferroelectric capacitors C00 and C10, to be read to the bit lines BL0 and BL1. Thus, if the residual polarization of the ferroelectric capacitor C00 is positive and that of the ferroelectric capacitor C10 is negative, the voltage at the bit line BL0 is higher than the voltage at the bit line BL1.

At timing t34, the potential difference between the bit lines BL0 and BL1 is amplified with a sense amplifier to a value as large as the potential difference between 0 V (VSS) and the supply voltage VDD, to read data. At timing t35, the potential at the cell plate line PL is turned to L level (VSS=0 V). Thereafter, data rewriting is carried out for the ferroelectric capacitors C00 and C10.

At timing t36, the potential at the word line WL0 is turned to L level, to turn OFF the memory cell transistors Q00 and Q10. This electrically isolates the bit lines BL0 and BL1 from the first electrodes of the ferroelectric capacitors C00 and C10, so that the first electrodes of the ferroelectric capacitors C00 and C10 are temporarily put in a floating state.

At timing t37, the potential at the reset control signal line RC0 is raised to H level to turn ON the reset transistors QR00 and QR10. As a result, the potential at the first electrodes of the ferroelectric capacitors C00 and C10 becomes 0 V (VSS), and thus the potential difference between the first and second electrodes is substantially zero.

At timing t38, the bit lines BL0 and BL1 are precharged to the potential of 0 V, to enter the standby state.

In this example, as in the previous examples, the potential difference between the two electrodes of each ferroelectric capacitor C is kept substantially zero over the period (standby period) other than the period during reading (from timing t31 to timing t37). Accordingly, as in the first example, the residual polarization state at the ferroelectric capacitor C is suppressed from being corrupted. In particular, noise may be generated in the ground voltage due to noise generated during driving of the cell plate line, and this noise in the ground voltage may vary the potential at cell plate lines corresponding to non-selected memory cells. This may results in reducing the data retaining characteristic of the non-selected memory cells and corrupting data. This example can effectively solve such a trouble. In addition, when the reset transistor QR is turned ON at timing t37, in the memory cell isolated from the bit lines due to the turning OFF of the word line only the potential at the first electrodes of the ferroelectric capacitors C00 and C10 is reset. The bit lines BL0 and BL1 are reset at a subsequent timing. Therefore, this example has an advantage that the memory cell is free from influence of noise generated when the bit lines are reset.

Also advantageous is that the reset can be done at high speed if the capacitance of the ferroelectric capacitor is small.

In addition, as will be described later, by sharing the cell plate line PL, the occupation area of the memory cell array is reduced, and high reliability is ensured.

Note that in this example, at timing t35 after reading, the cell plate line PL00 must be turned to L level for refreshing (rewriting).

4. Fourth Example

Referring to FIG. 25B, in this example, as in the previous example, during the standby state (until timing t41) the voltage at the cell plate line PL is VSS (0 V). The voltage at the reset voltage supply line RS is fixed to the same voltage (VSS) as that at the cell plate line PL at all times during the standby state. During the standby state, the reset transistors QR00 and QR10 are kept ON by setting the signal on the reset control signal line RC0 at H level, so that the potentials at the two electrodes of each of the ferroelectric capacitors C00 and C10 are both VSS. In other words, by having little potential difference between the two electrodes of each of the ferroelectric capacitors C00 and C10, the residual polarization of the ferroelectric film is controlled to be free from corruption. The bit lines BL0 and BL1 have been precharged to the potential of 0 V. The potential at the word line WL0 is L naturally.

At timing t41, the potential at the word line WL0 is turned to H level, to turn ON both memory cell transistors Q00 and Q10. This connects the bit lines BL0 and BL1 and the first electrodes of the ferroelectric capacitors C00 and C10, respectively.

At timing t42, the potential at the reset control signal line RC is turned to L level to turn OFF the reset transistors QR00 and QR10 and thus to put the first electrodes of the ferroelectric capacitors C00 and C10 in a floating state. The bit lines BL0 and BL1 are also put in a floating state.

Thereafter, at timing t43, the potential at the cell plate line PL is turned to H level (VDD). This allows the voltages at the first electrodes, which correspond to the potential at the cell plate PL and the polarization of the ferroelectric capacitors C00 and C10, to be read to the bit lines BL0 and BL1. Thus, if the residual polarization of the ferroelectric capacitor C00 is positive and that of the ferroelectric capacitor C10 is negative, the voltage at the bit line BL0 is higher than the voltage at the bit line BL1.

At timing t44, the potential difference between the bit lines BL0 and BL1 is amplified with a sense amplifier to a value as large as the potential difference between 0 V (VSS) and the supply voltage VDD, to read data. At timing t45, the potential at the cell plate line PL is turned to L level (VSS=0 V). Thereafter, data rewriting is carried out for the ferroelectric capacitors C00 and C10.

At timing t46, the bit lines BL0 and BL1 are precharged to the potential of 0 V, to enter the standby state. This turns the potential at the first electrodes of the ferroelectric capacitors C00 and C10 to 0 V (VSS).

At timing t47, the potential at the reset control signal line RC0 is raised to H level to turn ON the reset transistors QR00 and QR10. As a result, the potential difference between the first and second electrodes of the ferroelectric capacitors C00 and C10 is substantially zero.

At timing t48, the potential at the word line WL0 is turned to L level, to turn OFF the memory cell transistors Q00 and Q10. This electrically isolates the bit lines BL0 and BL1 from the first electrodes of the ferroelectric capacitors C00 and C10.

In this example, as in the previous examples, the potential difference between the two electrodes of each ferroelectric capacitor C is kept substantially zero over the period (standby period) other than the reading period (from timing t42 to timing t47). Accordingly, as in the first example, the residual polarization state at the ferroelectric capacitor C is suppressed from being corrupted. In particular, noise may be generated in the ground voltage due to noise generated during driving of the cell plate line, and this noise in the ground voltage may vary the potential at cell plate lines corresponding to non-selected memory cells. This may results in reducing the data retaining characteristic of the non-selected memory cells and corrupting data. This example can effectively solve such a trouble. In addition, in this example, the reset transistor QR is turned OFF at timing t42 after the word line WL has been selected. Therefore, the memory cell is advantageously free from influence of noise generated at the rising of the word line. The memory cell is reset by way of the bit lines before the falling of the word line WL. Therefore, high-speed reset is possible using the large-capacity bit line reset circuit. Since the reset transistor is turned ON before the falling of the word line, influence of noise generated during the falling of the word line can be reduced. Moreover, as will be described later, by sharing the cell plate line PL, the occupation area of the memory cell array is reduced, and high reliability is ensured.

Note that in this example, at timing 45 after reading, the cell plate line PL00 must be turned to L level for refreshing (rewriting).

The operations in the first to fourth examples may partly be combined. For example, timing t31 in the third example may be shifted to a point between timing t32 and timing t33, so as to reduce influence of noise generated during the rising of the word line in the third example.

The cell plate lines are not driven in the first and second examples. However, as in the third and fourth examples, influence of noise generated at the rising and falling of the word lines can be reduced by controlling the operation of the reset transistors. In this way, by providing and driving the reset transistors, it is possible to reduce the lowering of the data retaining characteristic of the ferroelectric capacitors and corruption of data.

Structure on Semiconductor Substrate

Figure 2:
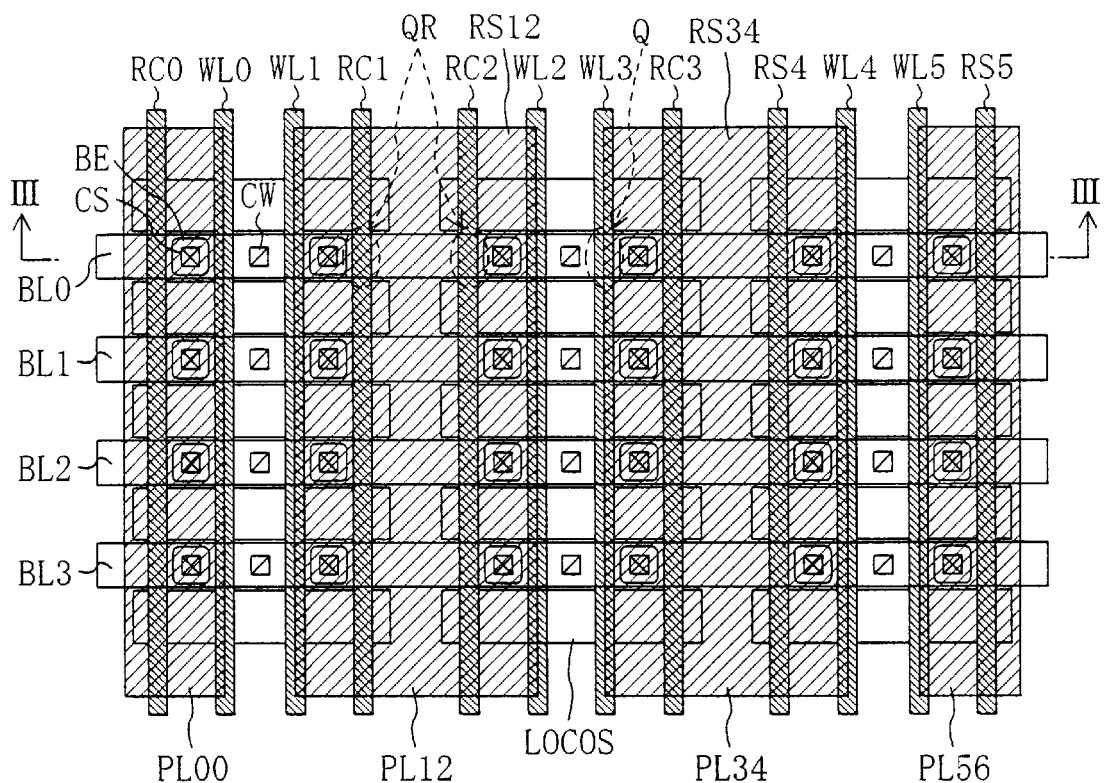
FIG. 2 is a top view of the ferroelectric memory of the first embodiment, illustrating only the structure of the memory cell array located on a semiconductor substrate.

The structure of the memory cell array of the ferroelectric memory located on the semiconductor substrate will be described. FIG. 2 is a top view of the ferroelectric memory of this embodiment where only the structure of the memory cell array located on the semiconductor substrate is illustrated and an interlayer insulating film is transparent. FIG. 3 is a cross-sectional view taken along line III—III of FIG. 2.

As shown in FIGS. 2 and 3, active regions (source/drain regions, channel regions, and the like) of the transistors Q are formed in a semiconductor substrate 10. The word lines WL made of polysilicon, which serve as gate electrodes at positions above the channel regions, extend above the semiconductor substrate 10. Capacitance portions are formed above the respective source regions of the transistors Q. Each capacitance portion includes: a bottom electrode BE (first electrode) of the ferroelectric capacitor C, made of any of metals including metals of platinum and iridium group, which is an equivalent of a storage node of a DRAM; a ferroelectric film FD made of $KNO_3$, $PbLa_2O_3$—$ZrO_2$—$TiO_2$ (PLZT), $PbTiO_3$—$PbZrO_3$ (PZT), or the like; and a top electrode TE (second electrode) made of any of metals including metals of platinum and iridium group. The bottom electrode BE of the capacitance portion is connected to the source of the memory cell transistor Q via a contact CS. This structure of the capacitance portion is called a stacked capacitor structure. The top electrodes TE constitute the cell plate lines PL that extend in parallel with the word lines WL shown in FIG. 2. Above the capacitance portions, the bit lines BL extend in a direction parallel with the cross section of FIG. 3, and connected to the drain regions of the memory cell transistors Q via contacts CW. This structure is a so-called bit-line top structure.

Figure 23:
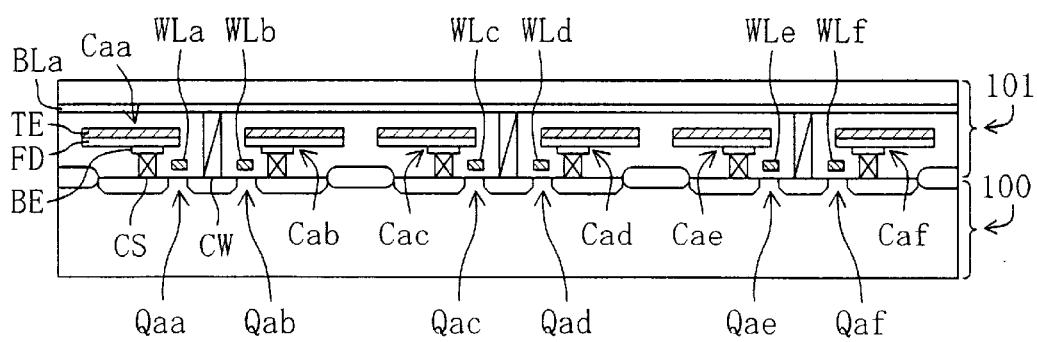
FIG. 23 is a cross-sectional view taken along line XXIII—XXIII of FIG. 22.

The first structural feature of the memory cell array in this embodiment is that the top electrodes TE of two adjacent ferroelectric capacitors (for example, C01 and C02) constitute a common cell plate line PL12, to which a constant voltage (½) VDD is applied at all times. This eliminates the necessity of securing of the two cell plate lines from each other as in the conventional structure having the two cell plate lines PLb and PLc (see FIG. 22). This reduces the occupation area of the memory cell array. The reset transistors QR are formed in the area corresponding to the area in the conventional structure shown in FIG. 23 where storage node portions (portions between the source regions) of the memory cells are isolated by LOCOS. The reset transistors QR themselves serve as isolation regions when they are in the OFF state. Therefore, the occupation area is little increased by the formation of the reset transistors QR.

The second structural feature of the memory cell array in this embodiment is that there are formed the reset transistors QR that have source regions shared with the memory cell transistors Q and have drain regions constituting the reset voltage supply lines RS. The reset transistors QR have gate electrodes facing the word lines WL as the gate electrodes of the memory cell transistors Q with the contacts CS therebetween. The gate electrodes of the reset transistors constitute the reset control signal lines RC. In this way, by sharing the source regions and constructing the reset voltage supply lines RS from the diffusion layers (drain regions), the area of the memory cell array can be further reduced.

Since the bit-line top structure is adopted, wiring of the bit lines is easy.

An interlayer insulating film 11 is formed over the semiconductor substrate to burying the contacts CS, the bottom electrodes BE, the ferroelectric films FD, the top electrodes TE (cell plate lines PL), the contacts CW, the bit lines BL, the reset control signal lines RC, and the like.

In this embodiment, in the aspect of circuit configuration, the reset transistors are provided for the respective memory cell transistors. Therefore, data corruption is prevented without the necessity of refreshing, and thus low power consumption is realized.

In the structural aspect, the reset transistors sharing source regions with the memory cell transistors are provided for the respective memory cell transistors, and the drain regions of the reset transistors constitute the reset voltage supply lines. Therefore, the area of the memory cell array is reduced.

Second Embodiment

Circuit Configuration and Operation Mode

The circuit configuration and operation mode of a memory cell array of a ferroelectric memory of this embodiment are the same as those of the memory cell array of the ferroelectric memory of the first embodiment shown in FIGS. 1, 4A, and 4B. The only difference from the first embodiment is the structure on a semiconductor substrate.

Structure on Semiconductor Substrate

Figure 5:
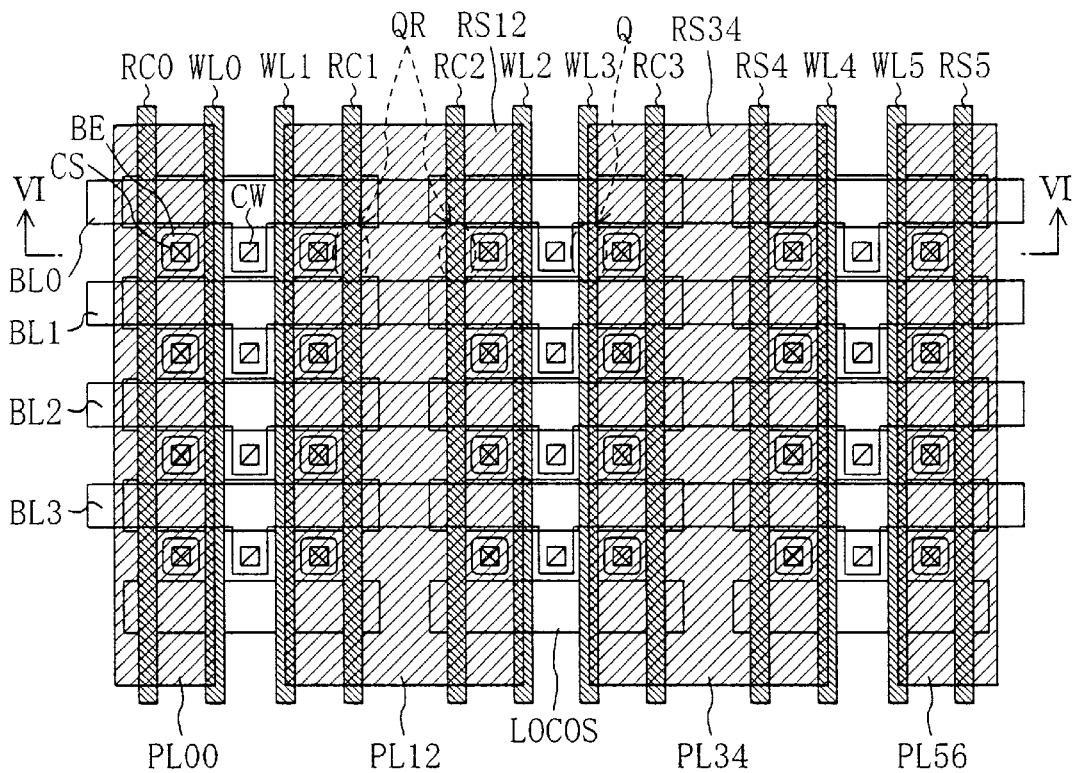
FIG. 5 is a top view of the ferroelectric memory of the second embodiment, illustrating only the structure of the memory cell array located on a semiconductor substrate.
Figure 6:
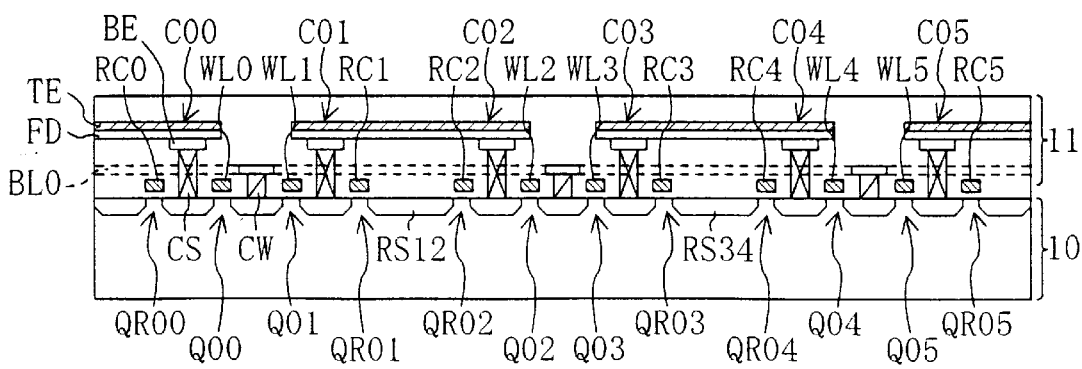
FIG. 6 is a cross-sectional view taken along line VI—VI of FIG. 5.

FIG. 5 is a top view of the ferroelectric memory of this embodiment where only the structure of the memory cell array located on the semiconductor substrate is illustrated and an interlayer insulating film is transparent. FIG. 6 is a cross-sectional view taken along line VI—VI of FIG. 5.

As shown in FIGS. 5 and 6, active regions (source/drain regions, channel regions, and the like) of the transistors Q are formed in the semiconductor substrate 10. The word lines WL made of polysilicon, which serve as gate electrodes at positions above the channel regions, extend above the semiconductor substrate 10. Above the word lines WL, the bit lines BL extend in a direction parallel with the cross section of FIG. 6, and connected to the drain regions of the memory cell transistors Q via contacts CW. Above the bit lines BL, capacitance portions are formed. Each capacitance portion includes: a bottom electrode BE (first electrode) of the ferroelectric capacitor C, made of any of metals including metals of platinum and iridium group, which is an equivalent of a storage node of a DRAM; a ferroelectric film FD made of $KNO_3$, $PbLa_2O_3$—$ZrO_2$—$TiO_2$ (PLZT), $PbTiO_3$—$PbZrO_3$ (PZT), or the like; and a top electrode TE (second electrode) made of any of metals including metals of platinum and iridium group. The bottom electrode BE of the capacitance portion is connected to the source of the memory cell transistor Q via a contact CS. This structure of the capacitance portion is called the stacked capacitor structure. The top electrodes TE constitute the cell plate lines PL that extend in parallel with the word lines WL shown in FIG. 5. This structure is a so-called bit-line bottom structure.

A feature of this embodiment is that the bit-line bottom structure is-adopted unlike the first embodiment. The other features described in the first embodiment are also provided for this embodiment.

Therefore, in addition to the effects obtained in the first embodiment, this embodiment has the effect of securing a larger capacitance for the ferroelectric capacitors C since the ferroelectric capacitors can be formed in a broader area above the bit lines BL. Another effect is that since steps formed by the bit lines BL are smaller compared with those formed by the capacitance portions, processing such as wiring can be easily performed above the bit lines.

Third Embodiment

Circuit Configuration and Operation Mode

Figure 7:
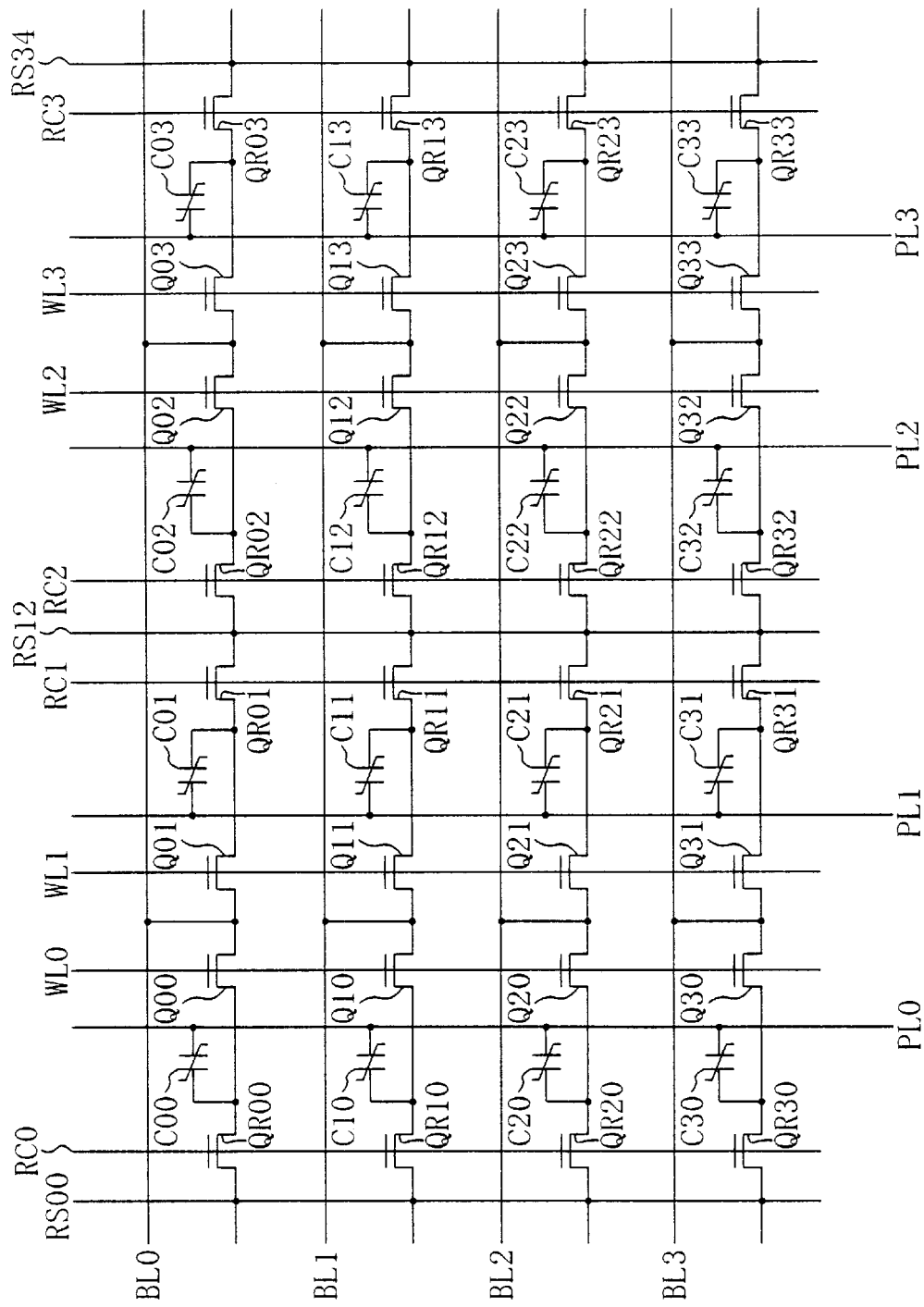
FIG. 7 is an electric circuit diagram illustrating a circuit configuration of a memory cell array of a ferroelectric memory of the third embodiment of the invention.

FIG. 7 is an electric circuit diagram illustrating a circuit configuration of a memory cell array of a ferroelectric memory of the third embodiment of the present invention. As shown in FIG. 7, the construction of the memory cell array of the ferroelectric memory of this embodiment is the same as that of the memory cell array of the ferroelectric memory of the first embodiment shown in FIG. 1, except that cell plate lines PL are provided individually.

The operation mode of the ferroelectric memory of this embodiment is the same as that of the ferroelectric memory of the first embodiment shown in FIGS. 4A and 4B. The only difference from the first embodiment is the structure on the semiconductor substrate.

Therefore, although adjacent memory cells do not share the cell plate line PL, the same effects as those described in the first embodiment are obtained in the aspect of circuit operation.

Structure on Semiconductor Substrate

Figure 8:
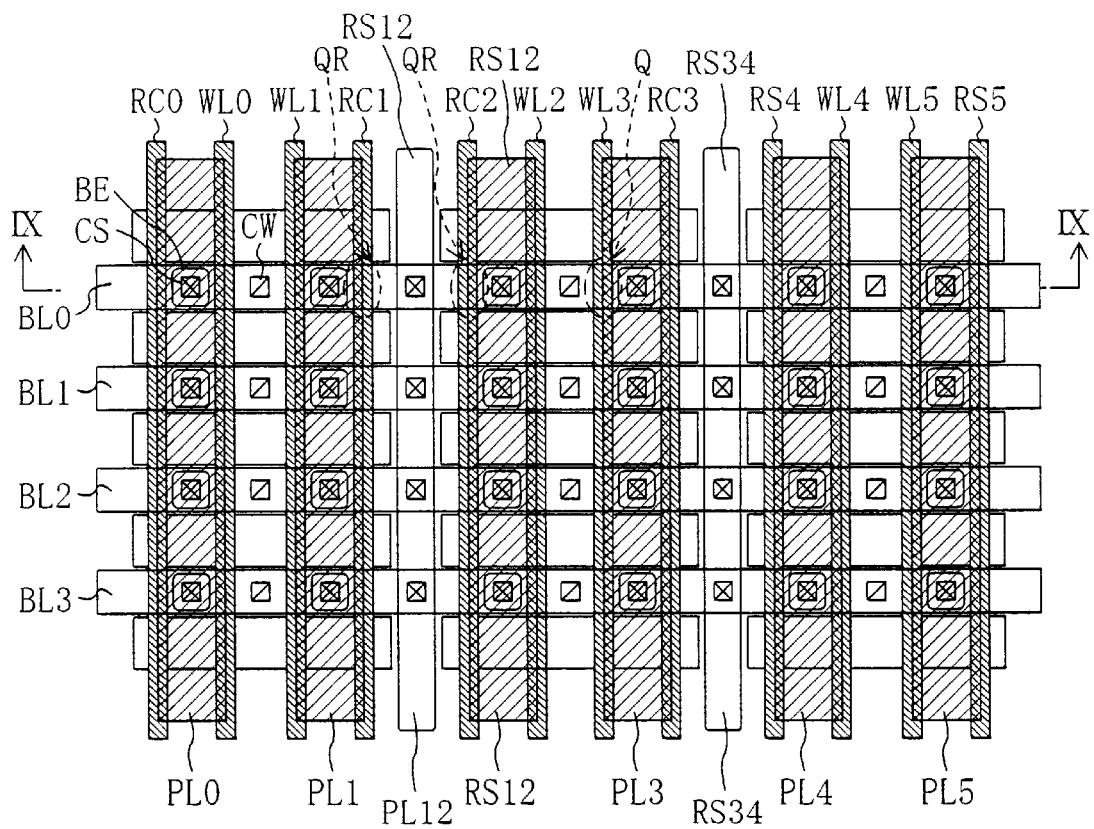
FIG. 8 is a top view of the ferroelectric memory of the third embodiment, illustrating only the structure of the memory cell array located on a semiconductor substrate.
Figure 9:
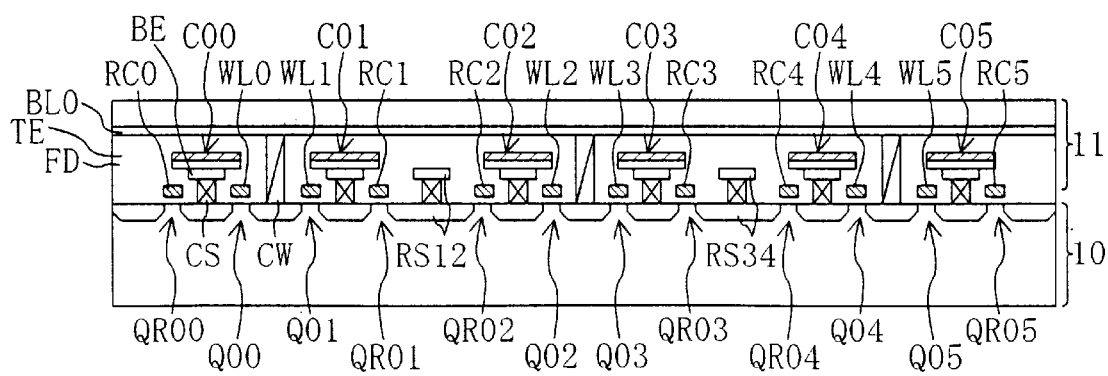
FIG. 9 is a cross-sectional view taken along line IX—IX of FIG. 8.

FIG. 8 is a top view of the ferroelectric memory of this embodiment where only the structure of the memory cell array located on the semiconductor substrate is illustrated and an interlayer insulating film is transparent. FIG. 9 is a cross-sectional view taken along line IX—IX of FIG. 8.

As shown in FIGS. 8 and 9, the structural features of the memory cell array in this embodiment on the semiconductor substrate distinguished from the first embodiment are as follows. The top electrodes TE constituting the cell plate lines PL are not shared. Low-resistance backing lines are formed above the drain regions of the reset transistors QR and connected with the drain regions. The backing lines and the drain regions constitute the reset voltage supply lines RS. In this embodiment, the low-resistance lines are made of the same material as the bottom electrodes BE of the ferroelectric capacitors. In other words, when a film of platinum or the like is deposited and patterned to form the bottom electrodes BE, the patterning is made to form the backing lines simultaneously.

The other structure is the same as that of the first embodiment. The bit-line top structure is adopted in this embodiment.

In this embodiment, the resistance of the reset voltage supply lines RS can be lowered compared with that in the first embodiment. This enables the reset voltage supply lines RS to be swiftly shifted to and retained at a desired voltage (½) VDD during the standby state after activation of the device. Therefore, the effect of preventing data corruption is eminent.

Fourth Embodiment

Circuit Configuration and Operation Mode

Figure 10:
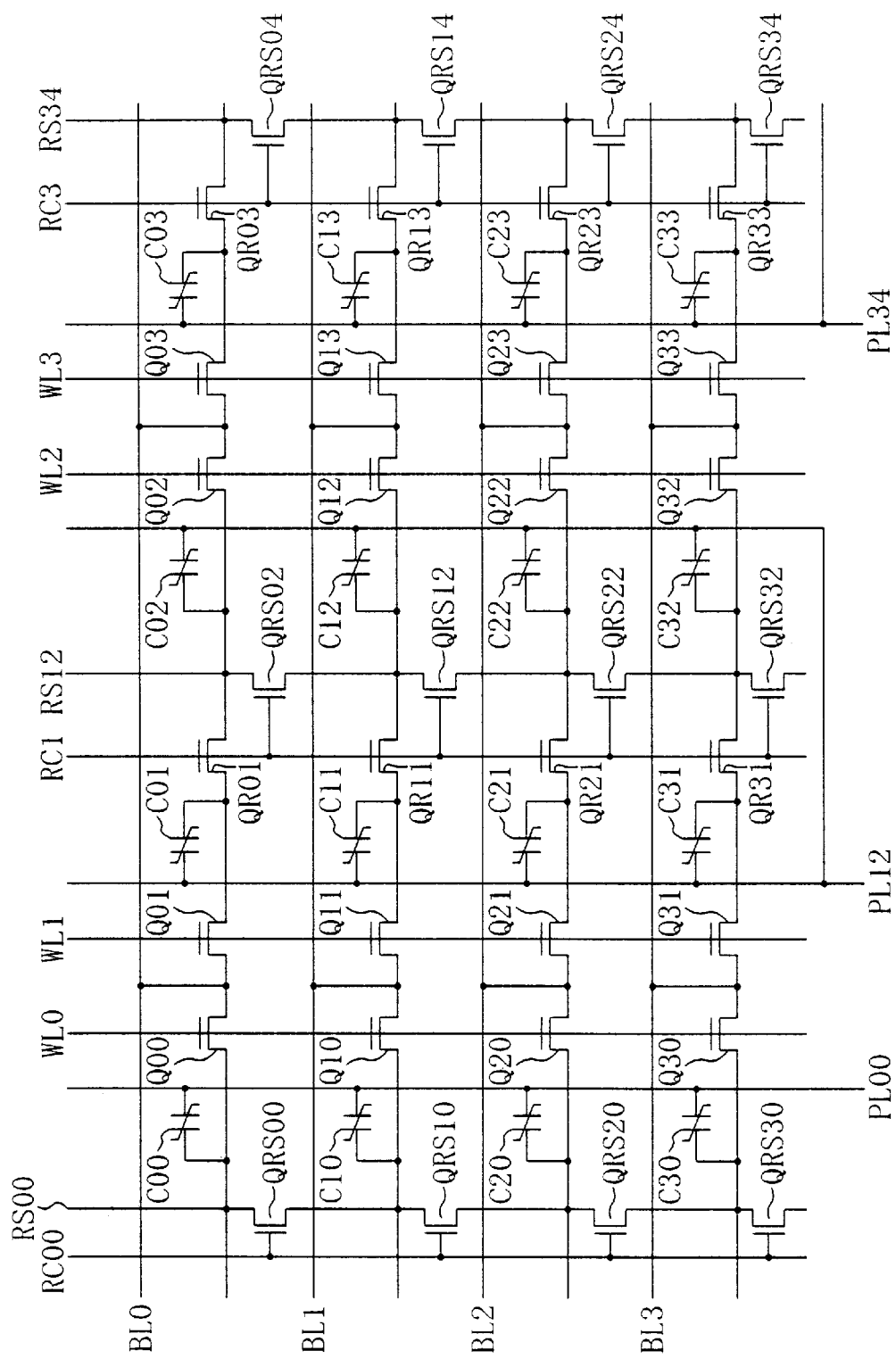
FIG. 10 is an electric circuit diagram illustrating a circuit configuration of a memory cell array of a ferroelectric memory of the fourth embodiment of the invention.

FIG. 10 is an electric circuit diagram illustrating a circuit configuration of a memory cell array of a ferroelectric memory of the fourth embodiment of the present invention. As shown in FIG. 10, the memory cell array of the ferroelectric memory of this embodiment is different from the memory cell array of the ferroelectric memory of the first embodiment in that adjacent memory cells also share the reset transistors QR. In addition, word-line direction reset transistors QRS are formed on the reset voltage supply transistors QRS are formed on the reset voltage supply lines RS between the memory cells adjacent in the word line direction. The operation of the word-line direction reset transistors QRS is controlled with the signal on the reset control signal lines RC.

For example, the voltage applied to the first electrodes of two ferroelectric capacitors C01 and C02, which are connected to a reset control signal line RC1 and a reset voltage supply line RS12, will be described. During the standby state, all the reset transistors QR and QRS are in the ON state, and thus the voltage (½) VDD is applied to the first electrodes of the ferroelectric capacitors C01 and C02. During reading, simultaneously with the turning OFF of the reset transistors QR at timing t11, t21 shown in FIG. 4A, 4B, the word-line direction reset transistors QRS are turned OFF, allowing the first electrodes of the ferroelectric capacitors C01 and C02 to be floated. In the first embodiment, the intermediate potential (½) VDD is applied at all times to the first electrodes of the ferroelectric capacitors of the memory cells connected to non-selected word lines during reading. In this embodiment, however, the intermediate potential (½) VDD is not applied to the first electrode of the ferroelectric capacitor C of the memory cell that is connected to a non-selected word line but shares the reset transistor QR with the memory cell connected to the selected word line. However, this causes no inconvenience because the period of time during which the first electrode of the ferroelectric capacitor C is in the floating state is short as described in the first embodiment.

As described above, the operation mode of the ferroelectric memory of this embodiment is basically the same as that of the ferroelectric memory of the first embodiment shown in FIG. 4A or 4B. Therefore, in the aspect of the circuit operation, the same effects as those described in the first embodiment are obtained in this embodiment.

Structure on Semiconductor Substrate

Figure 11:
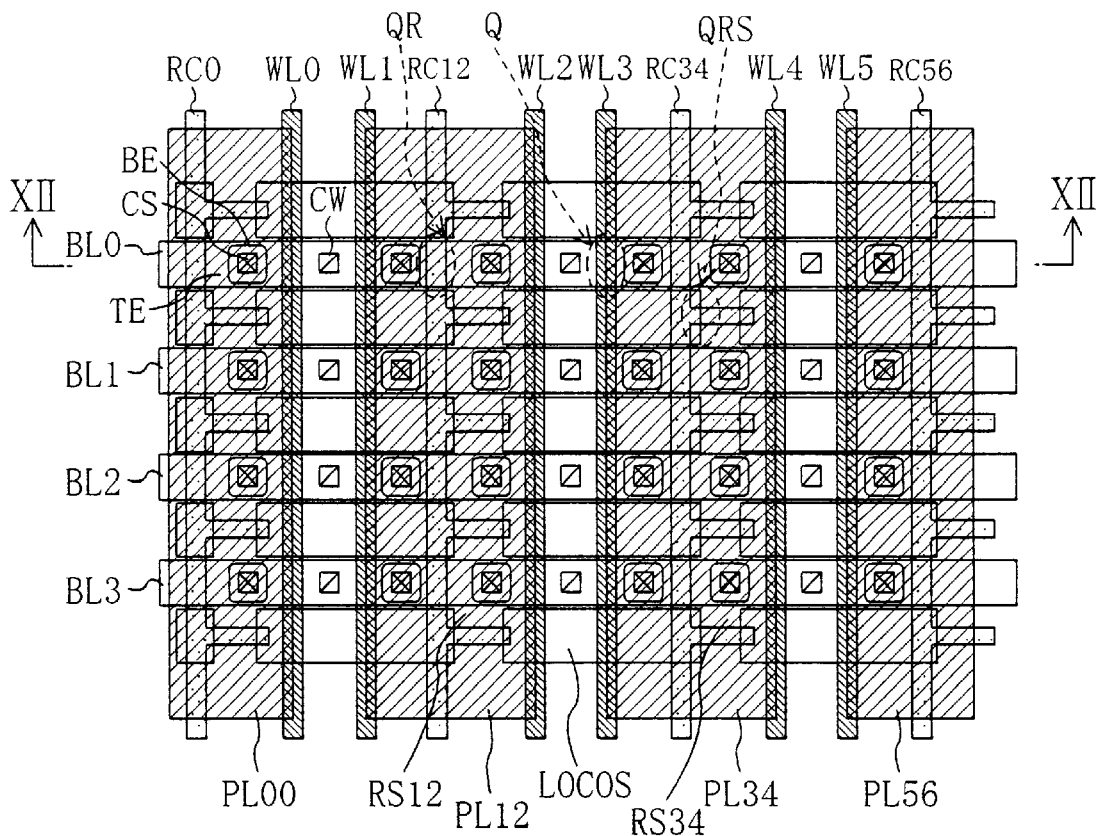
FIG. 11 is a top view of the ferroelectric memory of the fourth embodiment, illustrating only the structure of the memory cell array located on a semiconductor substrate.
Figure 12:
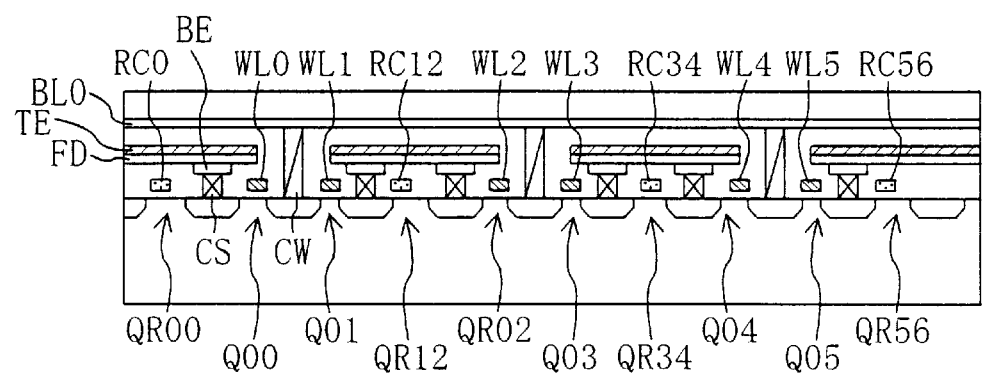
FIG. 12 is a cross-sectional view taken along line XII—XII of FIG. 11.

The structure of the memory cell array of the ferroelectric memory on the semiconductor substrate will be described. FIG. 11 is a top view of the ferroelectric memory of this embodiment where only the structure of the memory cell array located on the semiconductor substrate is illustrated and an interlayer insulating film is transparent. FIG. 12 is a cross-sectional view taken along line XII—XII of FIG. 11.

The feature of this embodiment distinguished from the first embodiment is that, in the two memory cells sharing the cell plate line PL, the reset transistor QR interposed between the memory cells shares the source regions of the memory cell transistors Q located on both sides to use as its diffusion layers. This greatly reduces the occupation area of the memory cell array compared with the first embodiment. In this embodiment, the word-line direction reset transistors QRS are newly required. However, as shown in FIG. 11, the word-line direction reset transistors QRS can be obtained only by forming protrusions branching from the reset control signal lines RC on one side at positions between the adjacent bit lines BL. The occupation area therefore little changes due to the formation of the word-line direction reset transistors QRS.

The reset control signal lines RC are formed to overlap a LOCOS isolation insulation film where possible. Therefore, the load of the reset control signal lines RC can be reduced, and thus the operation speed of the reset transistors QR and is QRS can be enhanced.

Fifth Embodiment
Circuit Configuration and Operation Mode

Figure 13:
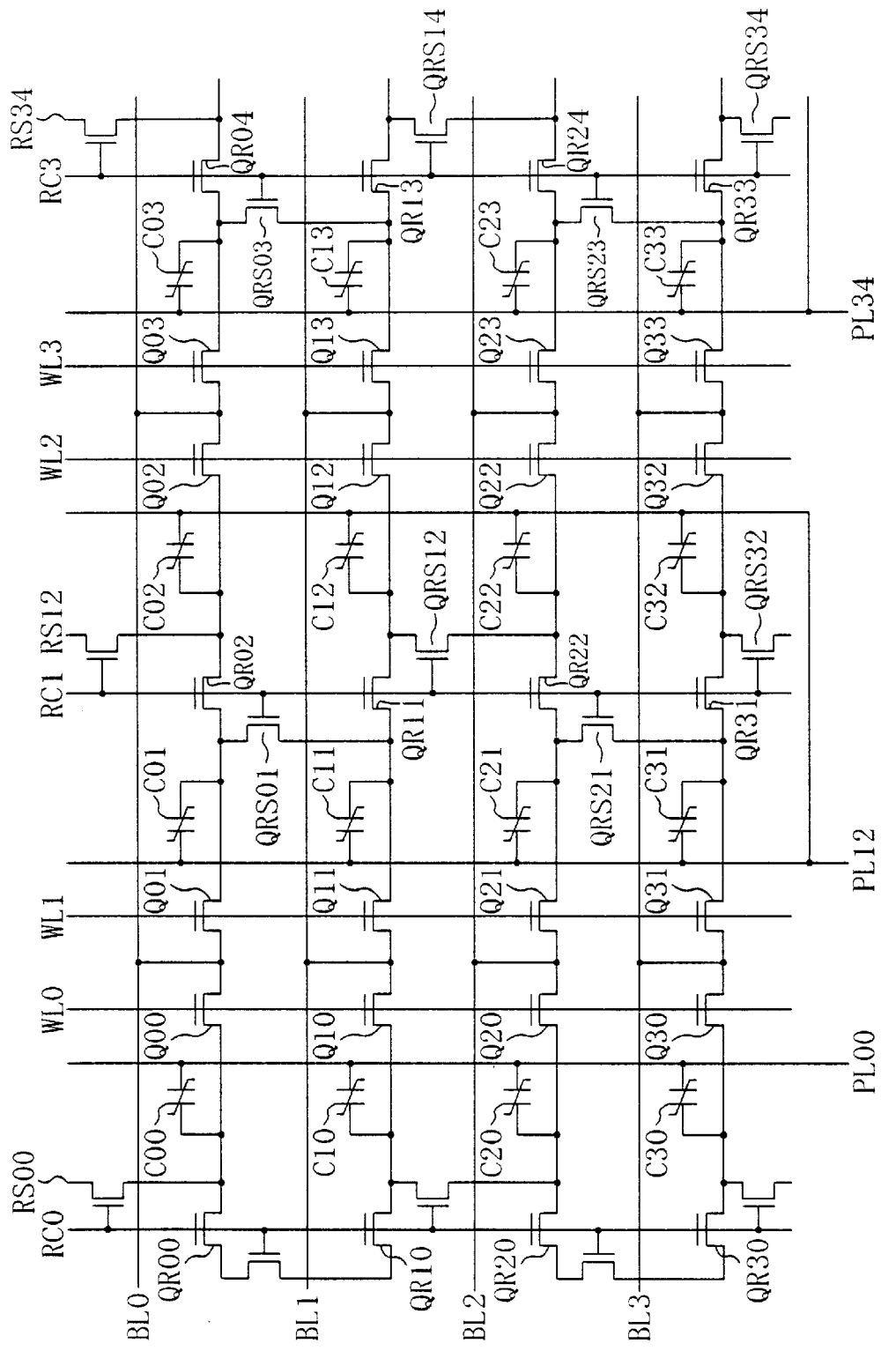
FIG. 13 is an electric circuit diagram illustrating a circuit configuration of a memory cell array of a ferroelectric memory of the fifth embodiment of the invention.

FIG. 13 is an electric circuit diagram illustrating a circuit configuration of a memory cell array of a ferroelectric memory of the fifth embodiment of the present invention. As shown in FIG. 13, the configuration of the memory cell array of the ferroelectric memory of this embodiment is basically the same as that of the memory cell array of the ferroelectric memory of the fourth embodiment shown in FIG. 10. That is, based on the configuration of the first embodiment, the adjacent memory cells share the reset transistors QR therebetween. In addition, word-line direction reset transistors QRS are formed. However, in this embodiment, unlike the fourth embodiment, each reset voltage supply line RS is constructed of a path connecting the reset transistors QS and the word-line direction reset transistors QRS in series. As in the fourth embodiment, the operation of the word-line direction transistors QRS is controlled with the signal on the reset control signal line RC.

The operation mode of the ferroelectric memory of this embodiment is basically the same as that of the ferroelectric a 10 memory of the first embodiment shown in FIGS. 4A and 4B. Therefore, in the aspect of the circuit operation, the same effects as those described in the first embodiment are obtained in this embodiment.

Structure on Semiconductor Substrate

Figure 14:
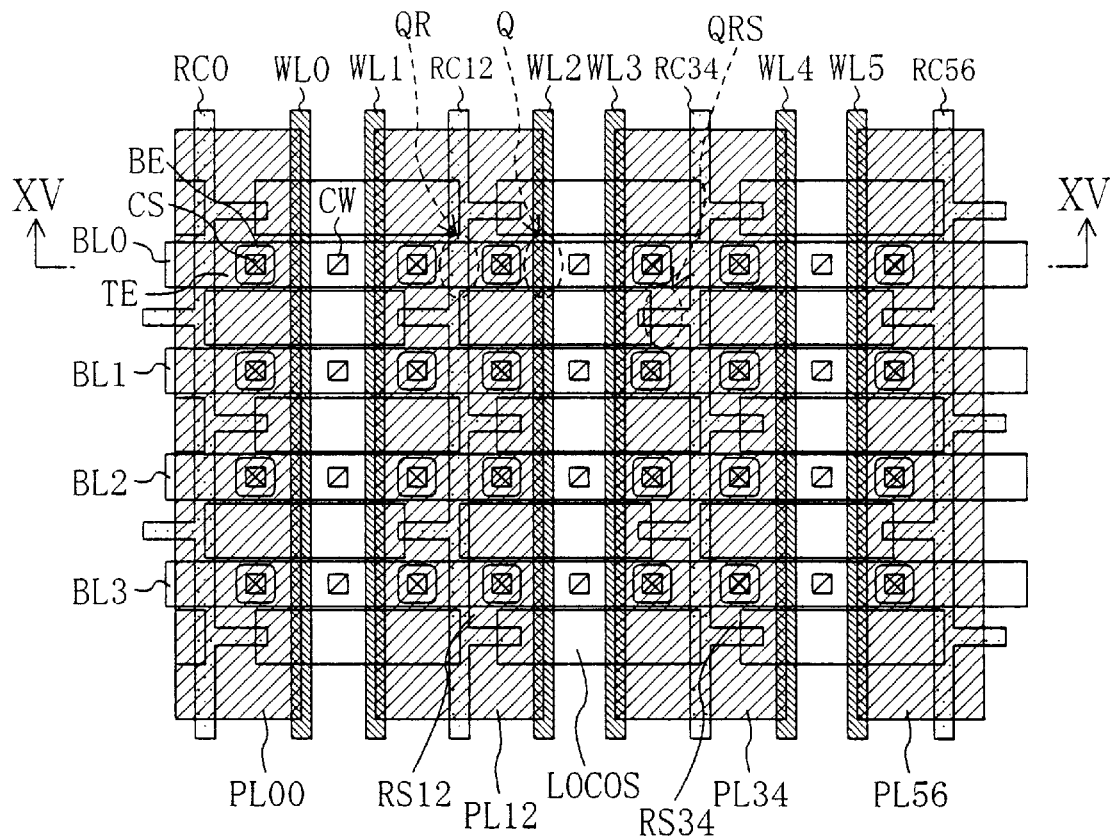
FIG. 14 is a top view of the ferroelectric memory of the fifth embodiment, illustrating only the structure of the memory cell array located on a semiconductor substrate.
Figure 15:
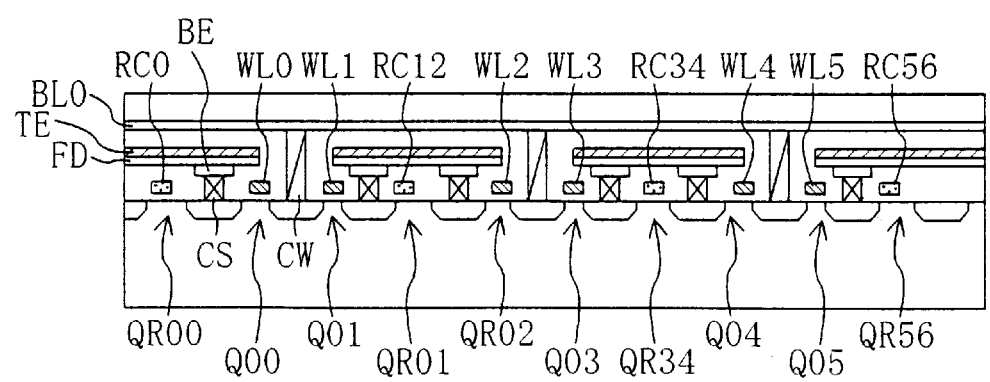
FIG. 15 is a cross-sectional view taken along line XV—XV of FIG. 14.

The structure of the memory cell array of the ferroelectric memory on the semiconductor substrate will be described. FIG. 14 is a top view of the ferroelectric memory of this embodiment where only the structure of the memory cell array located on the semiconductor substrate is shown and an inter layer insulating film is transparent. FIG. 15 is a cross-sectional view taken along line XV—XV of FIG. 14.

As the same feature of the fourth embodiment distinguished from the first embodiment, in the two memory cells sharing the cell plate line PL, the reset transistor QR interposed between the memory cells shares the source regions of the memory cell transistors Q located on both sides to use as its diffusion layers. This greatly reduces the occupation area of the memory cell array compared with the first embodiment. In this embodiment, the word-line direction reset transistors QRS are newly required. However, as shown in FIG. 14, the word-line direction reset transistors QRS can be obtained only by forming protrusions branching from the reset control signal lines RC on alternate sides at positions between the adjacent bit lines BL. The occupation area therefore little changes due to the formation of the word-line direction reset transistors QRS.

Unlike the fourth embodiment, the respective memory cells of the memory cell array in this embodiment have the same plan geometry. Therefore, in this embodiment, variation in geometry during the fabrication process can be reduced compared with the fourth embodiment.

Sixth Embodiment
Circuit Configuration and Operation Mode

Figure 16:
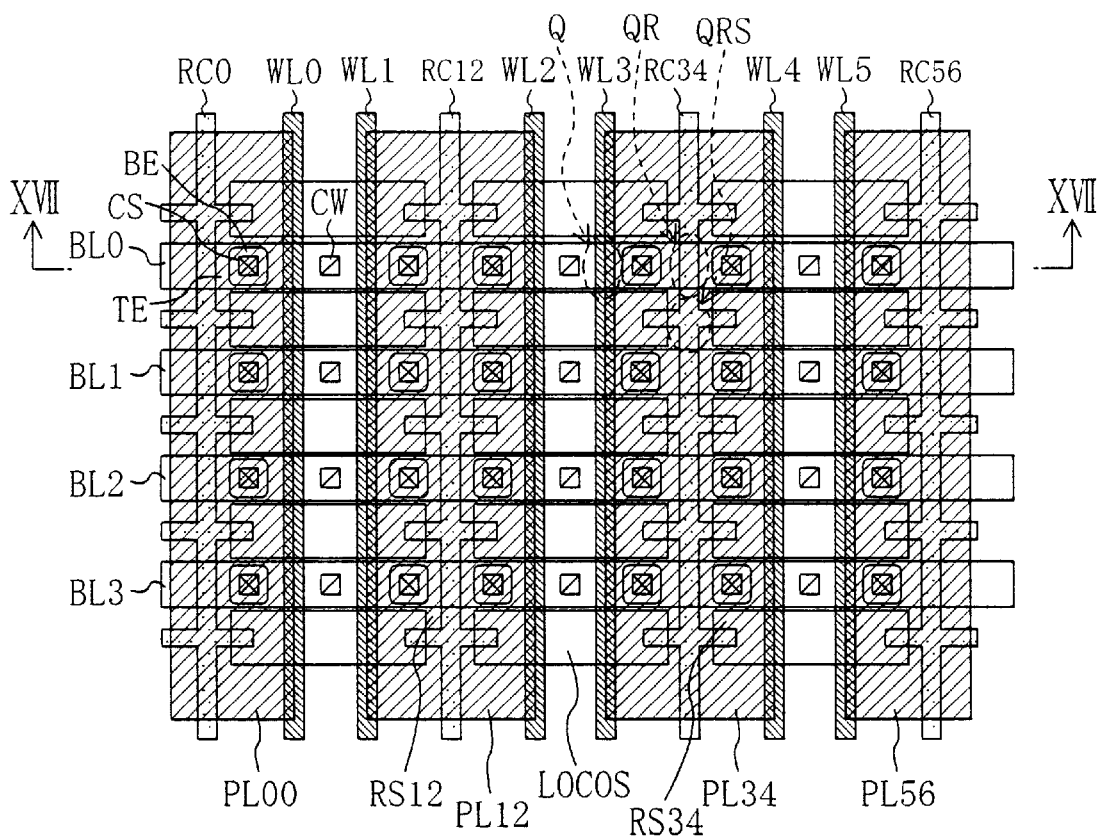
FIG. 16 is a top view of a ferroelectric memory of the sixth embodiment of the invention, illustrating only the structure of a memory cell array located on a semiconductor substrate.

Although the electric circuit diagram is omitted for this embodiment, the circuit configuration of a ferroelectric memory of this embodiment corresponds to a modification of the configurations in the fourth and fifth embodiments, where the reset transistors QR and the word-line direction reset transistors QRS are linearly formed, as will be understood from the top view of FIG. 16 to be described later. The operation mode of the ferroelectric memory of this embodiment is basically the same as that of the ferroelectric memory of the first embodiment shown in FIGS. 4A and 4B. Therefore, in the aspect of the circuit operation, the same effects as those described in the first embodiment are obtained in this embodiment.

Structure on Semiconductor Substrate

Figure 17:
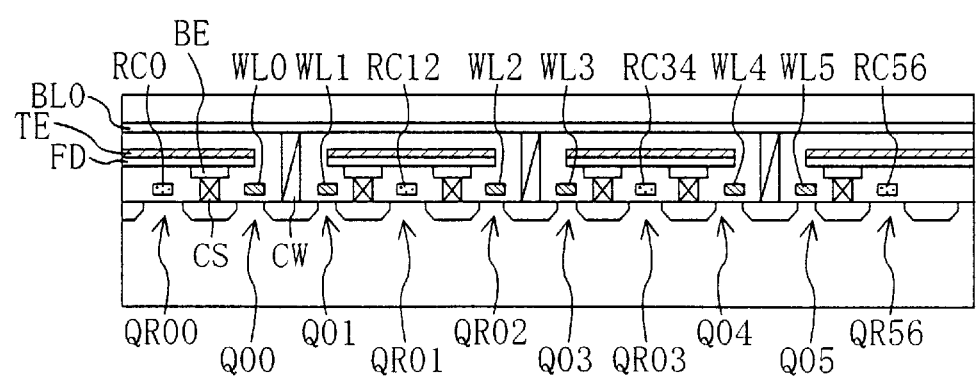
FIG. 17 is a cross-sectional view taken along line XVII—XVII of FIG. 16.

The structure of the memory cell array of the ferroelectric memory on the semiconductor substrate will be described. FIG. 16 is a top view of the ferroelectric memory of this embodiment where only the structure of the memory cell array located on the semiconductor substrate is illustrated and an interlayer insulating film is transparent. FIG. 17 is a cross-sectional view taken along line XVII—XVII of FIG. 16.

In this embodiment, basically as in the fourth and fifth embodiments, in the memory cells sharing the cell plate line PL, the reset transistor QR, interposed between the memory cells shares the source regions of the memory cell transistors Q located on both sides to, use as its diffusion layers. This greatly reduces the occupation area of the memory cell array compared with the first embodiment.

In this embodiment, unlike the fourth and fifth embodiments, the word-line direction reset transistors QRS are obtained by forming protrusions branching from the reset control signal lines RC on both sides at positions between the adjacent bit lines BL. The occupation area little changes due to the formation of the word-line direction reset transistors QRS.

In this embodiment, the diffusion layers constituting the reset voltage supply lines RS are linearly formed along the reset control signal lines, and thus, the resistance of the reset voltage supply lines RS can be reduced, compared with the fourth and fifth embodiment described above.

However, since the reset control signal lines RC as the gates of the reset transistors QR are mostly formed above the diffusion regions, the load of the reset control signal lines RC is greater compared with the fourth and fifth embodiments.

Seventh Embodiment
Circuit Configuration and Operation Mode

Figure 18:
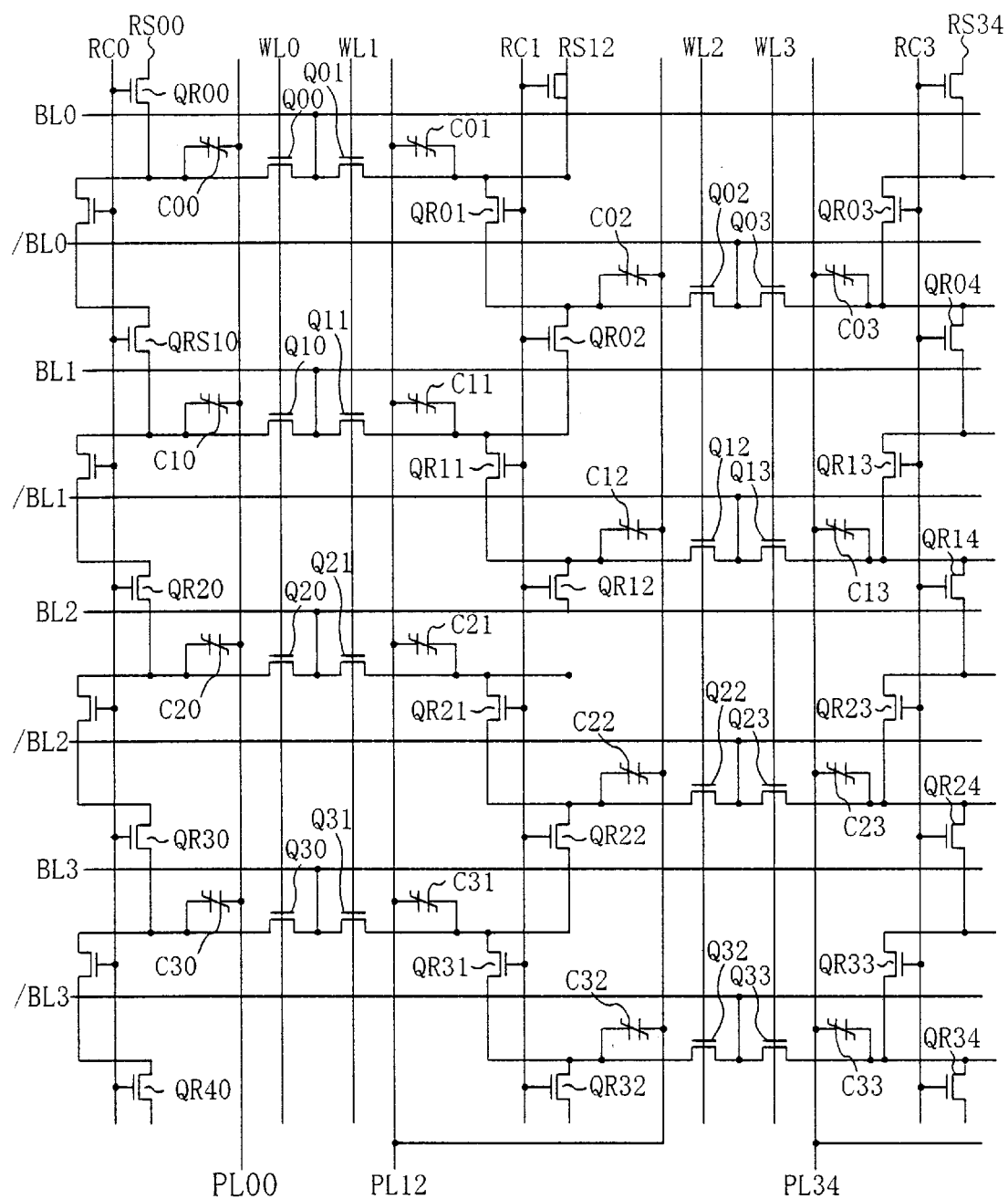
FIG. 18 is an electric circuit diagram illustrating a circuit configuration of a memory cell array of a ferroelectric memory of the seventh embodiment of the invention.

FIG. 18 is an electric circuit diagram illustrating the circuit configuration of a memory cell array of a ferroelectric memory of the seventh embodiment of the present invention. As shown in FIG. 18, the configuration of the memory cell array of the ferroelectric memory of this embodiment is different from that of the memory cell array of the ferroelectric memory of the first embodiment shown in FIG. 1 in that complementary bit lines BL, /BL are formed and the connection of the memory cells to the bit lines are alternately switched between the bit lines BL and the bit lines /BL every two adjacent memory cells, to be arranged in a zigzag fashion, so to speak. Sense amplifiers are provided between the complementary bit lines BL, /BL though not shown.

All the reset transistors QR are arranged to be at positions between the bit lines BL and /BL.

The first to sixth embodiments described above are applicable to both the 2T2C memory cell structure and the 1T1C memory cell structure. In particular, in order to secure high reliability, the 2T2C memory cell structure is preferable. On the contrary, the memory cell array in this embodiment is of the 1T1C memory cell structure.

Therefore, this embodiment can adopt a folded bit line structure with a large sense operation margin that can reduce occurrence of malfunction due to noise. Thus, high reliability is ensured. The configuration of this embodiment is therefore suitable for higher integration while maintaining high reliability.

Structure on Semiconductor Substrate

Figure 19:
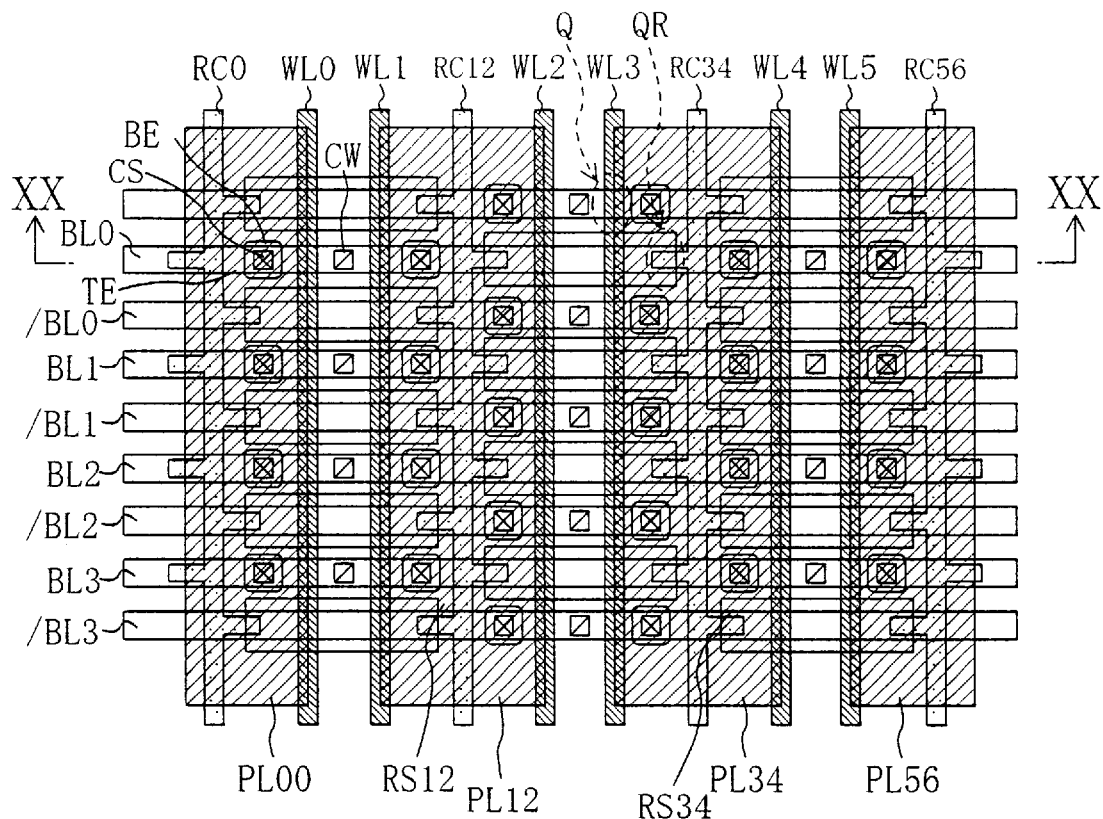
FIG. 19 is a top view of the ferroelectric memory of the seventh embodiment, illustrating only the structure of the memory cell array located on a semiconductor substrate.
Figure 20:
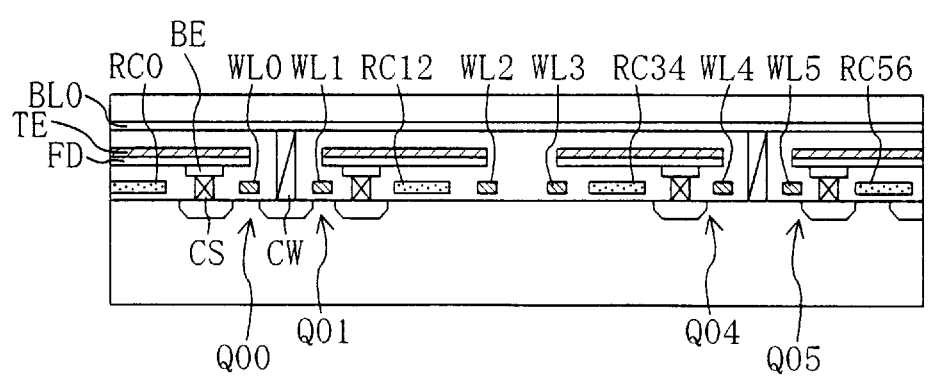
FIG. 20 is a cross-sectional view taken along line XX—XX of FIG. 19.
Figure 21:
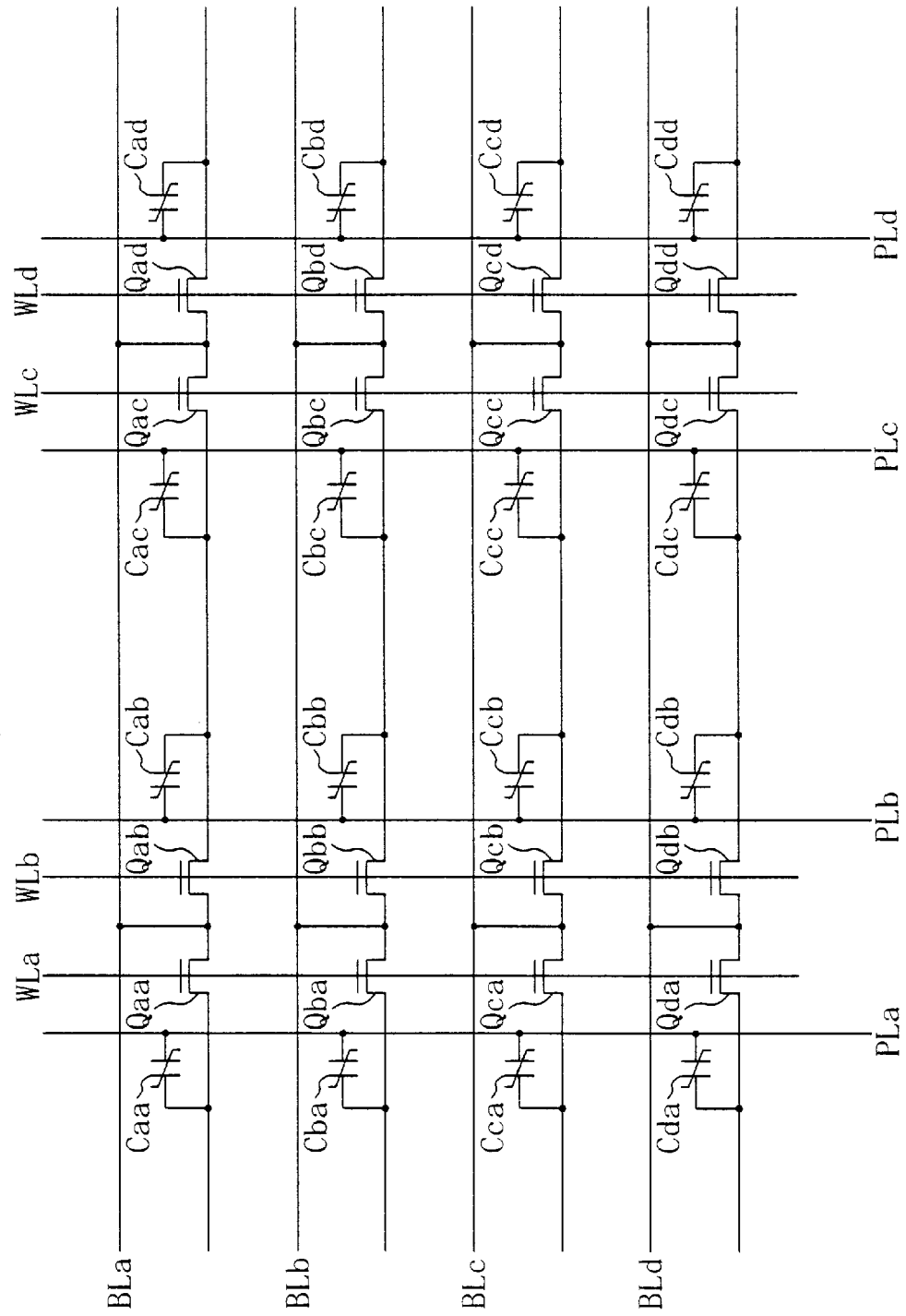
FIG. 21 is an electric circuit diagram illustrating a circuit configuration of a memory cell array of a conventional ferroelectric memory.

The structure of the memory cell,array of the ferroelectric memory on the semiconductor substrate will be described. FIG. 19 is a top view of the ferroelectric memory of this embodiment where only the structure of the memory cell array located on the semiconductor substrate is shown and an interlayer insulating film is transparent. FIG. 20 is a cross-sectional view taken along line XX—XX of FIG. 19.

Any of the layouts in the first to sixth embodiment described above can be adopted for this embodiment, although, herein as a representative, the layout in the fifth embodiment is shown. Therefore, as the effects obtained from the structure on the semiconductor substrate, the same effects as those described in the first to sixth embodiments are obtained for the respective layouts.

In this embodiment, the bit lines are grouped into the odd-numbered bit lines and the even-numbered bit lines so that they are selected by different word lines. The present invention is not limited to this arrangement, but grouping may be made so that two continuous bit lines (for example, /BL0 and BL1) are selected by the same word line.

What is claimed is:

1. A ferroelectric memory device comprising:
    a plurality of word lines;
    a plurality of bit lines crossing with the plurality of word lines;
    a plurality of memory cells arranged in a matrix at respective crossings of the plurality of word lines and the plurality bit lines;
    at least one ferroelectric capacitor formed in each of the plurality of memory cells, the ferroelectric capacitor including a ferroelectric film and first and second electrodes sandwiching the ferroelectric film; and
    at least one memory cell transistor formed in each of the plurality of memory cells, the memory cell transistor being interposed between the bit line and the first electrode of the ferroelectric capacitor, a gate of the memory cell transistor being connected to the word lines,
    wherein within each of the plurality of memory cells further comprising,
        cell plate lines connected to the second electrode of the ferroelectric capacitors;
        reset voltage supply lines for supplying a voltage having a potential substantially identical to the potential at the cell plate lines;
        reset transistors formed of switching transistors each interposed between the reset voltage supply line and the first electrode of the ferroelectric capacitor; and
        reset control signal lines for controlling ON/OFF of the reset transistors.

2. The ferroelectric memory device of claim 1, wherein the memory cell includes each two of the memory cell transistors and the ferroelectric capacitors, and includes one reset transistor for each of the ferroelectric capacitors.

3. The ferroelectric memory device of claim 1, wherein the amplitude of a voltage at the bit lines is between a supply potential and a ground potential, and
    the cell plate lines supply an intermediate potential between the supply potential and the ground potential.

4. The ferroelectric memory device of claim 1, wherein the reset transistors are configured to be ON during a standby period.

5. The ferroelectric memory device of claim 1, wherein the ferroelectric capacitor is of a stacked structure where the first electrode is formed below the second electrode.

6. The ferroelectric memory device of claim 1, wherein the adjacent memory cells share the cell plate line.

7. The ferroelectric memory device of claim 1, wherein the reset transistor and the memory cell transistor share one of diffusion layers.

8. The ferroelectric memory device of claim 1, wherein the reset voltage supply line is formed of a conductive layer including a diffusion layer.

9. The ferroelectric memory device of claim 8, wherein the reset voltage supply line includes a backing line layer connected to a diffusion layer.

10. The ferroelectric memory device of claim 9, wherein the backing line layer is made of the same metal material as the first electrodes of the ferroelectric capacitors.

11. The ferroelectric memory device of claim 1, wherein the reset transistor for switching the connection between the first electrode of the ferroelectric capacitor of one of two adjacent memory cells and the reset voltage supply line is interposed between the memory cell transistors of the two memory cells, and shares diffusion layers with the memory cell transistors on both sides, and
    the other reset transistor for switching the connection between the first electrode of the ferroelectric capacitor of the other of the two adjacent memory cells and the reset voltage supply line is formed so as to share diffusion layers with two memory cell transistors adjacent along the word line.

12. The ferroelectric memory device of claim 11, wherein the reset control signal line serving as the gate electrodes of the reset transistors has protrusions branching on one side at positions between the bit lines to serve as gate electrodes of the other reset transistors.

13. The ferroelectric memory device of claim 11, wherein the reset control signal line serving as gate electrodes of the reset transistors has protrusions branching on alternate sides at positions between the bit lines to serve as gate electrodes of the other reset transistors.

14. The ferroelectric memory device of claim 11, wherein the reset control signal line serving as gate electrodes of the reset transistors has protrusions branching on both sides at positions between the bit lines to serve as gate electrodes of the other reset transistors.

15. The ferroelectric memory device of claim 1, wherein the bit lines constitute bit pairs each composed of a first bit line and a second bit line formed with a sense amplifier therebetween, and
    memory cells among the plurality of memory cells connected to a common bit line belong to either a first memory cell group connected to the first bit line or a second memory cell group connected to the second bit line.

16. The ferroelectric memory device of claim 15, wherein each of the memory cells includes one, memory cell transistor and one ferroelectric capacitor,
    the memory cell transistors of two adjacent memory cells among the plurality of memory cells share one diffusion layer, and
    the memory cells are divided into the first memory cell groups connected to the first bit lines and the second memory cell groups connected to the second bit lines every two adjacent memory cells, resulting in the first memory cell groups and the second memory cell groups being arranged in a zigzag fashion on the plane.

17. The ferroelectric memory device of claim 1, wherein the amplitude of the bit lines is between a supply potential and a ground potential,
    the amplitude of the cell plate line for a selected memory cell among the memory cells is between the supply potential and the ground potential, and
    the reset control signal lines control the reset transistors of non-selected memory cells among the memory cells to be ON.

* * * * *